(12) United States Patent
Kim et al.

(10) Patent No.: US 11,758,670 B2
(45) Date of Patent: Sep. 12, 2023

(54) DISPLAY DEVICE

(71) Applicant: Samsung Display Co., Ltd., Yongin-Si (KR)

(72) Inventors: Jinhyoung Kim, Seoul (KR); Jin Yong Sim, Seongnam-si (KR); Munsik Ham, Cheonan-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 17/182,819

(22) Filed: Feb. 23, 2021

(65) Prior Publication Data

US 2022/0007528 A1    Jan. 6, 2022

(30) Foreign Application Priority Data

Jul. 2, 2020   (KR) .................. 10-2020-0081463

(51) Int. Cl.
| | |
|---|---|
| *H05K 5/02* | (2006.01) |
| *H05K 5/00* | (2006.01) |
| *G06F 1/16* | (2006.01) |
| *H10K 50/84* | (2023.01) |
| *E05D 3/12* | (2006.01) |
| *H10K 102/00* | (2023.01) |

(52) U.S. Cl.
CPC ......... *H05K 5/0226* (2013.01); *G06F 1/1681* (2013.01); *H05K 5/0017* (2013.01); *H10K 50/84* (2023.02); *E05D 3/122* (2013.01); *E05Y 2900/606* (2013.01); *H10K 2102/311* (2023.02)

(58) Field of Classification Search
None
See application file for complete search history.

(56) References Cited

U.S. PATENT DOCUMENTS

| | | | | |
|---|---|---|---|---|
| 5,987,704 | A * | 11/1999 | Tang | ..................... G06F 1/1681 16/342 |
| 9,119,316 | B2 | 8/2015 | Lee | |
| 9,250,733 | B2 | 2/2016 | Lee et al. | |
| 9,677,308 | B1 * | 6/2017 | Chen | .......................... E05D 3/06 |
| 9,848,502 | B1 * | 12/2017 | Chu | ........................ G06F 1/1681 |
| 2010/0283367 | A1 * | 11/2010 | Coleman | ................. E05D 3/022 74/436 |

(Continued)

FOREIGN PATENT DOCUMENTS

| | | | |
|---|---|---|---|
| KR | 101875855 | B1 | 7/2018 |
| KR | 101911047 | B1 | 10/2018 |
| KR | 101912751 | B1 | 10/2018 |

*Primary Examiner* — Abhishek M Rathod
(74) *Attorney, Agent, or Firm* — CANTOR COLBURN LLP

(57) ABSTRACT

A display device including: a display module; a first support part and a second support part which are disposed under the display module and spaced apart from each other in a first direction; a first gear connected to each of both sides of the first support part which are opposite each other in a second direction crossing the first direction; and a second gear connected to each of both sides of the second support part which face each other in the second direction, where the second gear is disposed adjacent to the first gear in the first direction and engaged with the first gear. When viewed in the second direction, each of the first gear and the second gear has a shape corresponding to at least a portion of an elliptical shape.

19 Claims, 15 Drawing Sheets

(56) References Cited

U.S. PATENT DOCUMENTS

| | | | |
|---|---|---|---|
| 2013/0322004 A1* | 12/2013 | Park | G06F 1/1637 |
| | | | 16/354 |
| 2013/0342090 A1* | 12/2013 | Ahn | G06F 1/1616 |
| | | | 312/258 |
| 2015/0184437 A1* | 7/2015 | Wikander | G06F 1/1681 |
| | | | 16/354 |
| 2016/0070310 A1* | 3/2016 | Holung | E05D 3/122 |
| | | | 361/679.09 |
| 2016/0205792 A1* | 7/2016 | Ahn | H05K 5/0017 |
| | | | 40/779 |
| 2017/0220077 A1* | 8/2017 | Holung | G06F 1/1681 |
| 2018/0136696 A1* | 5/2018 | Chen | H04M 1/0216 |
| 2019/0053391 A1* | 2/2019 | Wu | E05D 1/00 |
| 2019/0146561 A1* | 5/2019 | Escamilla | E05D 11/105 |
| | | | 361/679.27 |

* cited by examiner

DISPLAY DEVICE

This application claims priority to Korean Patent Application No. 10-2020-0081463, filed on Jul. 2, 2020, and all the benefits accruing therefrom under 35 U.S.C. § 119, the content of which in its entirety is herein incorporated by reference.

BACKGROUND

The present disclosure herein relates to a display device.

An electronic apparatus such as a smartphone, a digital camera, a laptop computer, a navigation device, and a smart television that provide images to users each include a display device for displaying an image. The display device generates an image and provides a user with the image through a display screen.

With the advance in technology for the display device, various types of the display device have been developed. For example, various flexible display devices have been developed which are deformable, foldable, or rollable into curved surface shapes. The flexible display devices having variously deformable shapes are easily carried and capable of improving convenience of users.

A foldable device among the flexible display devices is folded with respect to a folding axis extending in one direction. Development of technology has been demanded which is capable of more easily folding a folding region during a folding operation of a foldable display device, and more flatly unfolding the folding region during an unfolding operation.

SUMMARY

The present disclosure provides a display device in which during folding and unfolding operations, a folding region of a display module may be more easily folded or the folding region may be more flatly unfolded.

An embodiment of the inventive concept provides a display device including: a display module; a first support part and a second support part which are disposed under the display module and spaced apart from each other in a first direction; a first gear connected to each of both sides of the first support part which are opposite each other in a second direction crossing the first direction; and a second gear connected each of to both sides of the second support part which are opposite each other in the second direction, where the second gear is disposed adjacent to the first gear in the first direction, and engaged with the first gear. When viewed in the second direction, each of the first gear and the second gear has a shape corresponding to at least a portion of an elliptical shape.

In an embodiment of the inventive concept, a display device includes: a foldable display module; a first support part and a second support part which are disposed under the display module and are spaced apart from each other in a first direction; a first gear connected to each of both sides of the first support part that are opposite each other in a second direction crossing the first direction, where the first gear is configured to rotate about a first rotation axis extending in the second direction; and a second gear connected to each of both sides of the second support part that are opposite each other in the second direction, where the second gear is configured to rotate about a second rotation axis extending in the second direction and engaged with the first gear in the first direction. A first distance in the first direction between a first center point of the first gear and a second center point of the second gear when the display module is in an unfolded state is different from a second distance between the first center point and the second center point in the first direction when the display module is in a folded state.

In an embodiment of the inventive concept, a display device includes: a foldable display module; a first support part and a second support part which are disposed under the display module and are spaced apart from each other in a first direction; a first gear connected to each of both sides of the first support part that are opposite each other in a second direction crossing the first direction, where the first gear is configured to rotate about a first rotation axis extending in the second direction; and a second gear connected to each of both sides of the second support part that are opposite each other in the second direction, where the second gear is configured to rotate about a second rotation axis extending in the second direction, and engaged with the first gear in the first direction. A first distance in the first direction between a first center point of the first gear and the second center point of the second gear when the display module is unfolded is greater than or equal to a length of a curved surface of a folding region of the display module when the display module is folded, and the first center point of the first gear and the second center point of the second gear overlap the first rotation axis and the second rotation axis, respectively, when viewed in the second direction.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

In this specification, it will be understood that when an element (or a region, a layer, portion, etc.) is referred to as being "on", "connected to" or "coupled to" another element or layer, it can be directly on, connected or coupled to the another element, or a third intervening element may be present therebetween.

Like reference symbols refers to like elements. Also, in the figures, the thicknesses, the ratios and the dimensions of elements are exaggerated for effective illustration of technological contents.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or" includes all of one or more combinations that can be defined by associated items.

Although the terms such as "first" and "second" are used herein to describe various elements, these elements should not be limited by these terms. The terms are only used to distinguish one component from other components. For example, without departing from the scope of the present invention, a first component may be referred to as a second component, and similarly, the second component may also be referred to as the first component. Singular forms may include plural forms unless clearly defined otherwise in context.

In addition, terms such as "under", "below", "on", and "above" may be used to describe the relationship between elements illustrated in the figures. The terms have relative concept, and are described with respect to directions illustrated in the figures.

Unless defined otherwise, all terms (including technical terms and scientific terms) used in this specification have the same meaning as that generally understood by those skilled in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless so defined herein.

It will be further understood that the terms such as "includes" or "has", when used in this specification, specify the presence of stated features, numbers, steps, operations, elements, components or combinations thereof, but do not preclude the presence or addition of one or more other features, numbers, steps, operations, elements, components, and/or combinations thereof.

Hereinafter, embodiments will be described in detail with reference to the accompanying drawings.

Figure 1:
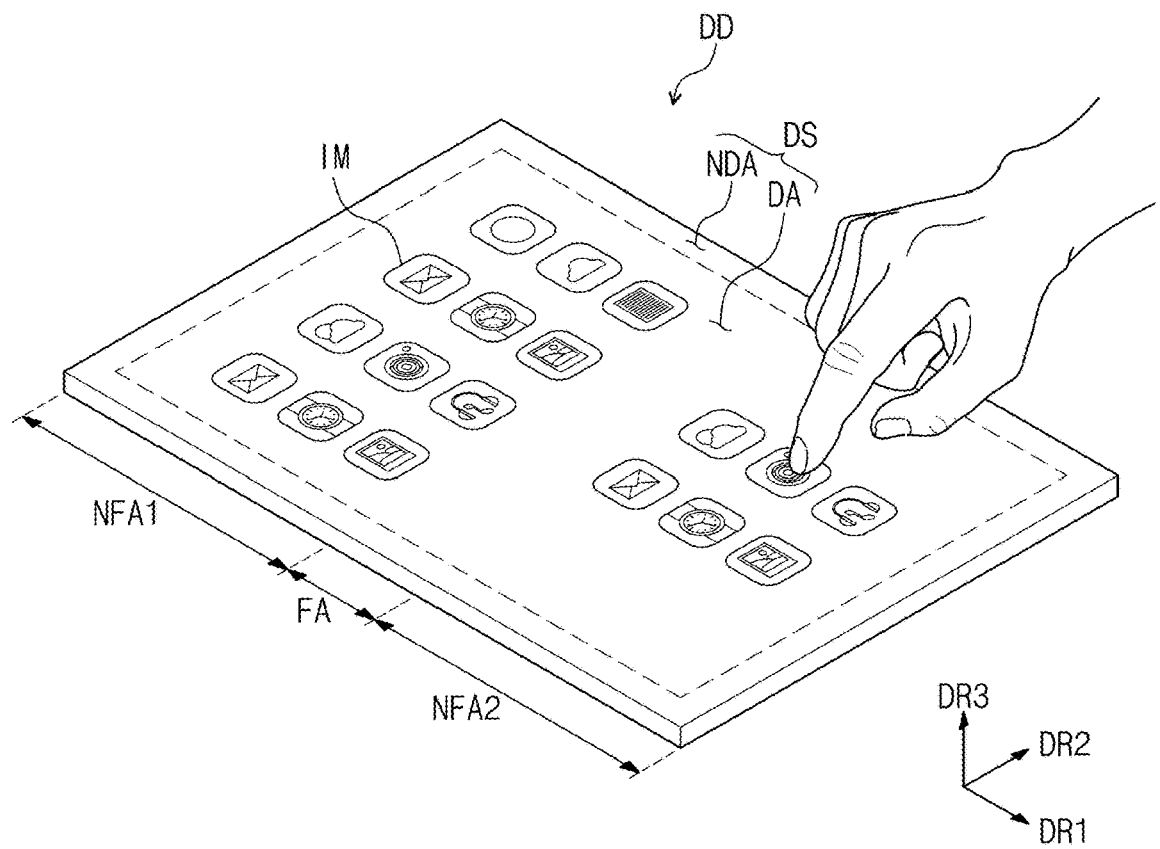
FIG. 1 is a perspective view of a display device according to an embodiment of the inventive concept.
Figure 2:
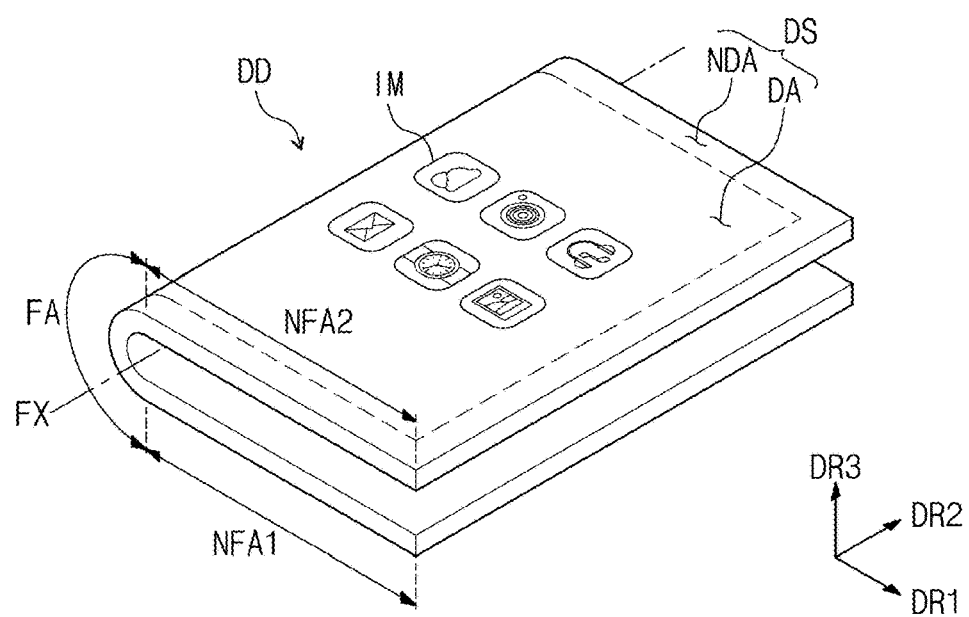
FIG. 2 is a view illustrating a folded state of the display device illustrated in FIG. 1.

FIG. 1 is a perspective view of a display device according to an embodiment of the inventive concept. FIG. 2 is a view illustrating a folded state of the display device illustrated in FIG. 1.

Referring to FIG. 1, a display device DD according to an embodiment of the inventive concept may have a rectangular shape having long sides extending in a first direction DR1 and short sides extending in a second direction DR2 crossing the first direction DR1. However, the embodiment of the inventive concept is not limited thereto, and the display device DD may have various shapes such as circles or polygons in another embodiment. The display device DD may be a flexible display device. FIG. 1 illustrates an unfolded state of the display device DD.

Hereinafter, a direction crossing the plane defined by the first direction DR1 and the second direction DR2 in a substantially perpendicular manner is defined as a third direction DR3. In this specification, the wording "when viewed in a plan view" may mean a case of viewing in the third direction DR3. The third direction DR3 corresponds to a "thickness direction" of the display device.

The display device DD may include a first non-folding region NFA1, a second non-folding region NFA2, and a folding region FA disposed between the first non-folding region NFA1 and the second non-folding region NFA2. The first non-folding region NFA1, the folding region FA, and the second non-folding region NFA2, may be aligned in the first direction DR1.

One folding region FA and two non-folding regions NFA1 and NFA2 are exemplarily illustrated in FIG. 1, but the numbers of the folding region FA and the non-folding regions NFA1 and NFA2 according to the invention are not limited thereto. For example, the display device DD may include a plurality of non-folding regions more than two and a plurality of folding regions disposed between the non-folding regions in another embodiment.

The front surface of the display device DD may be defined as a display surface DS for displaying an image and have a plane defined by the first direction DR1 and the second direction DR2. The images IM generated in the display device DD may be displayed through the display surface DS.

The display surface DS may include a display region DA and a non-display region NDA around the display region DA. The display region DA may display the image, and the non-display region NDA may not display any image. The non-display region NDA may define the border of the display device DD, and the border surrounds the display region DA and is colored in a predetermined color.

Referring to FIG. 2, the display device DD may be a foldable display device DD. For example, the folding region FA is bendable along a folding axis FX parallel to the second direction DR2, such that the display device DD may be folded. The folding axis FX may be defined as a short side axis parallel to the short sides of the display device DD.

The display device DD in FIG. 2 may be out-folded. That is, the display surface DS is exposed to the outside in the folded state. Thus, when the display device DD is folded, the display surface of the first non-folding region NFA1 and the display surface of the second non-folding region NFA2 may be disposed to face opposite directions from each other.

Figure 3:
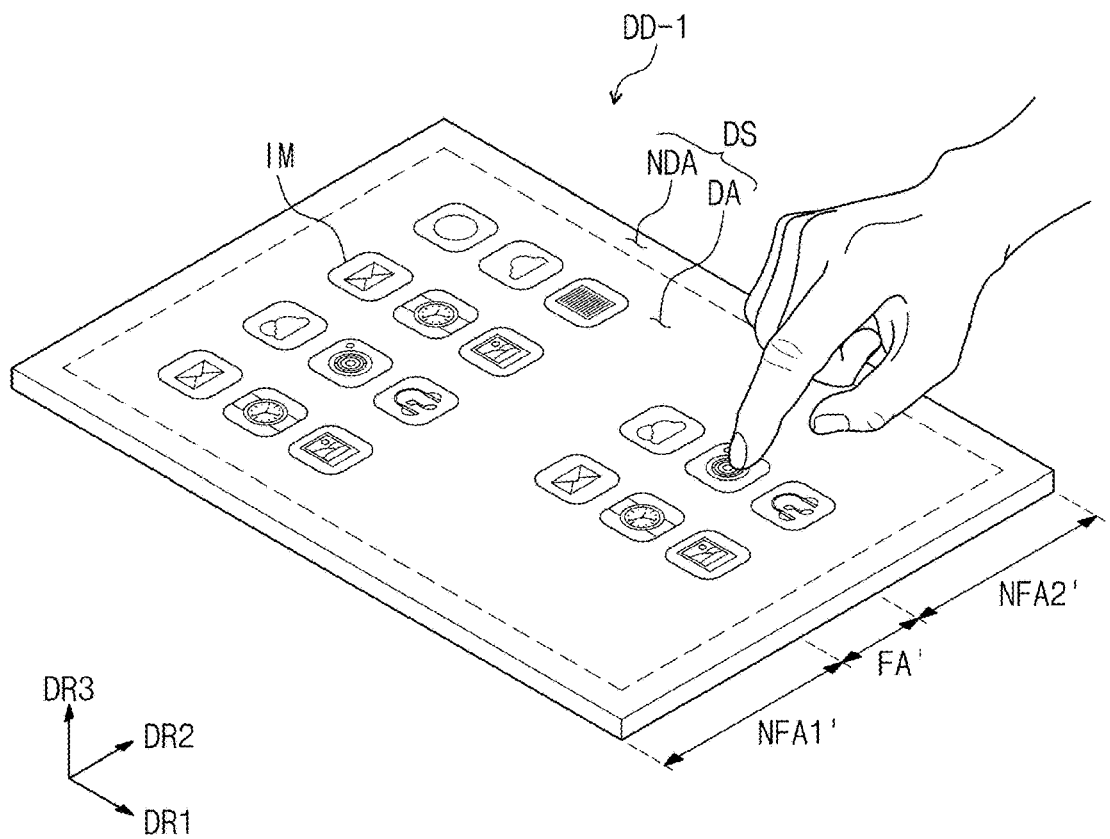
FIG. 3 is a perspective view of a display device according to another embodiment of the inventive concept.
Figure 4:
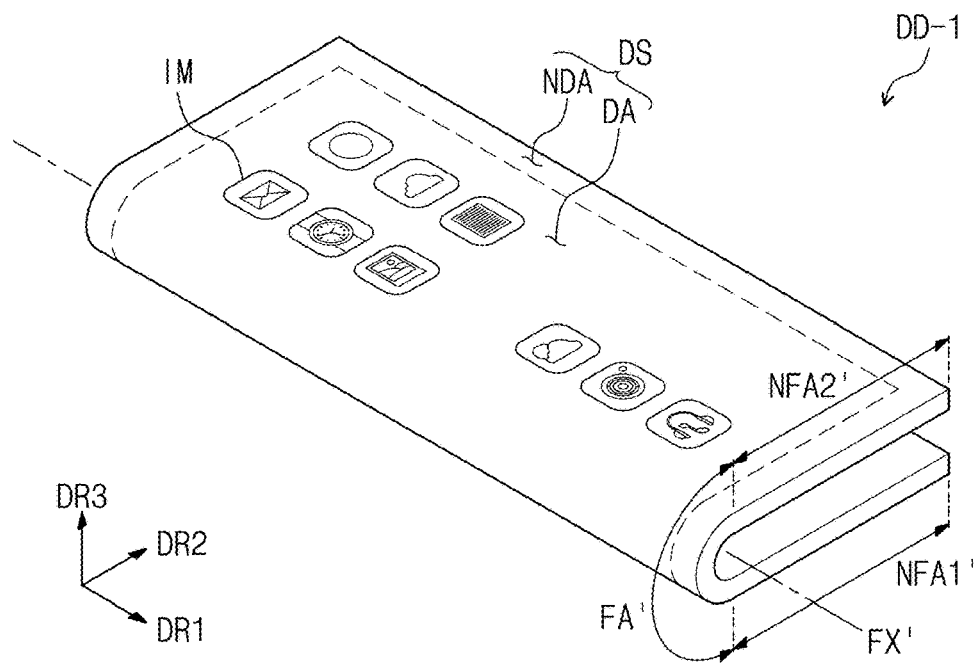
FIG. 4 is a view illustrating a folded state of the display device illustrated in FIG. 3.

FIG. 3 is a perspective view of a display device according to another embodiment of the inventive concept. FIG. 4 is a view illustrating a folded state of the display device illustrated in FIG. 3.

Except for folding operations, the display device DD-1 illustrated in FIG. 3 may have substantially the same configuration as the display device DD illustrated in FIG. 1. Thus, the folding operation of the display device DD-1 will hereinafter be mainly described.

Referring to FIGS. 3 and 4, the display device DD-1 may include a first non-folding region NFA1', a second non-folding region NFA2', and a folding region FA' disposed between the first non-folding region NFA1' and the second non-folding region NFA2'. The first non-folding region NFA1', the folding region FA' and the second non-folding region NFA2' may be aligned in the second direction DR2.

The folding region FA' is bendable along a folding axis FX' parallel to the first direction DR1, such that the display device DD-1 may be folded. The folding axis FX' may be defined as a longitudinal side axis parallel to the long sides of the display device DD-1. The display device DD illustrated in FIG. 1 may be folded with respect to the short side axis, while the display device DD illustrated in FIG. 3 may be folded with respect to the longitudinal side axis. The display device DD-1 may be out-folded such that the display surface DS is exposed to the outside when folded.

Hereinafter, a structure of the display device DD folded with respect to the short side axis (e.g., FIG. 2) will be described, but the embodiment of the inventive concept is not limited thereto, and the structures to be described later may also be applied to the display device DD-1 folded with respect to the longitudinal side axis.

The display devices DD and DD-1 may be used for large-size electronic devices such as televisions, monitors, or outdoor advertising boards. In addition, the display devices DD and DD-1 may also be used for small and medium size electronic devices such as personal computers, laptop computers, personal digital terminals, car navigation devices, game machines, smartphones, or cameras. However, these are merely presented as embodiments, and the display devices DD and DD-1 may be used for other electronic devices unless departing from the inventive concept in another embodiment.

Figure 5:
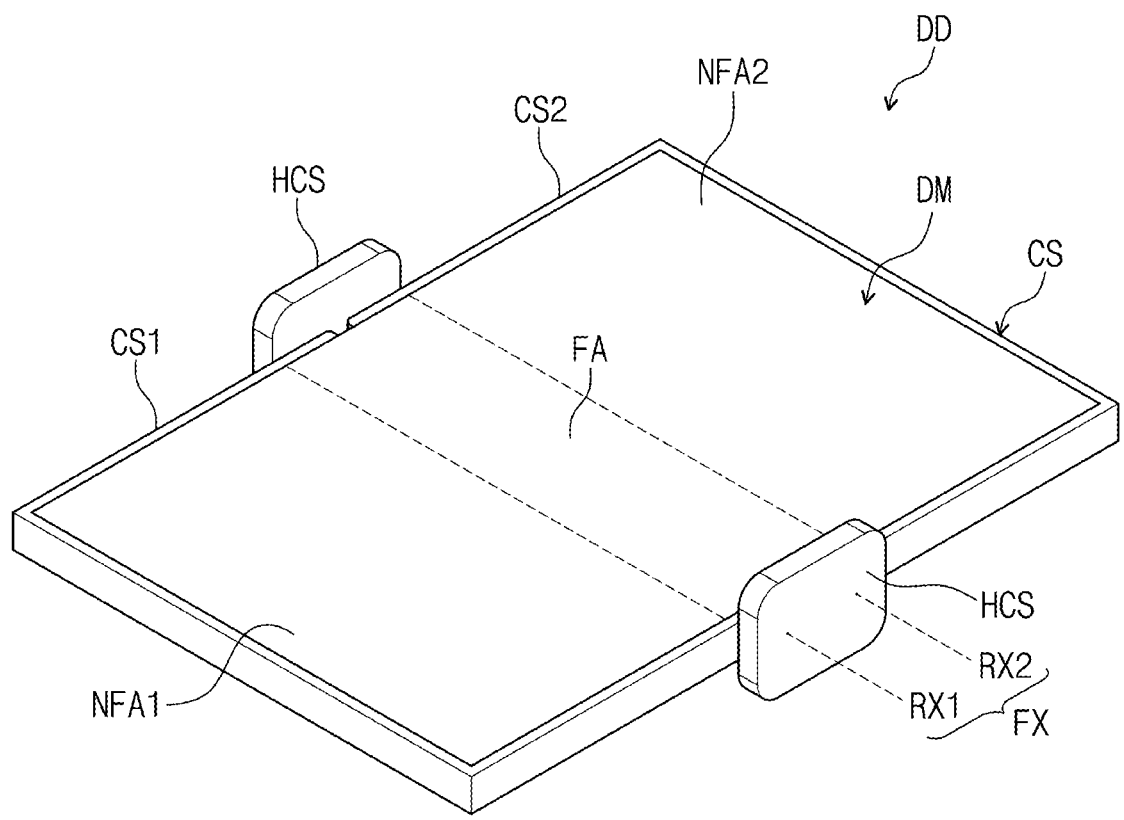
FIG. 5 is a view illustrating a configuration of the display device illustrated in FIG. 1.
Figure 6:
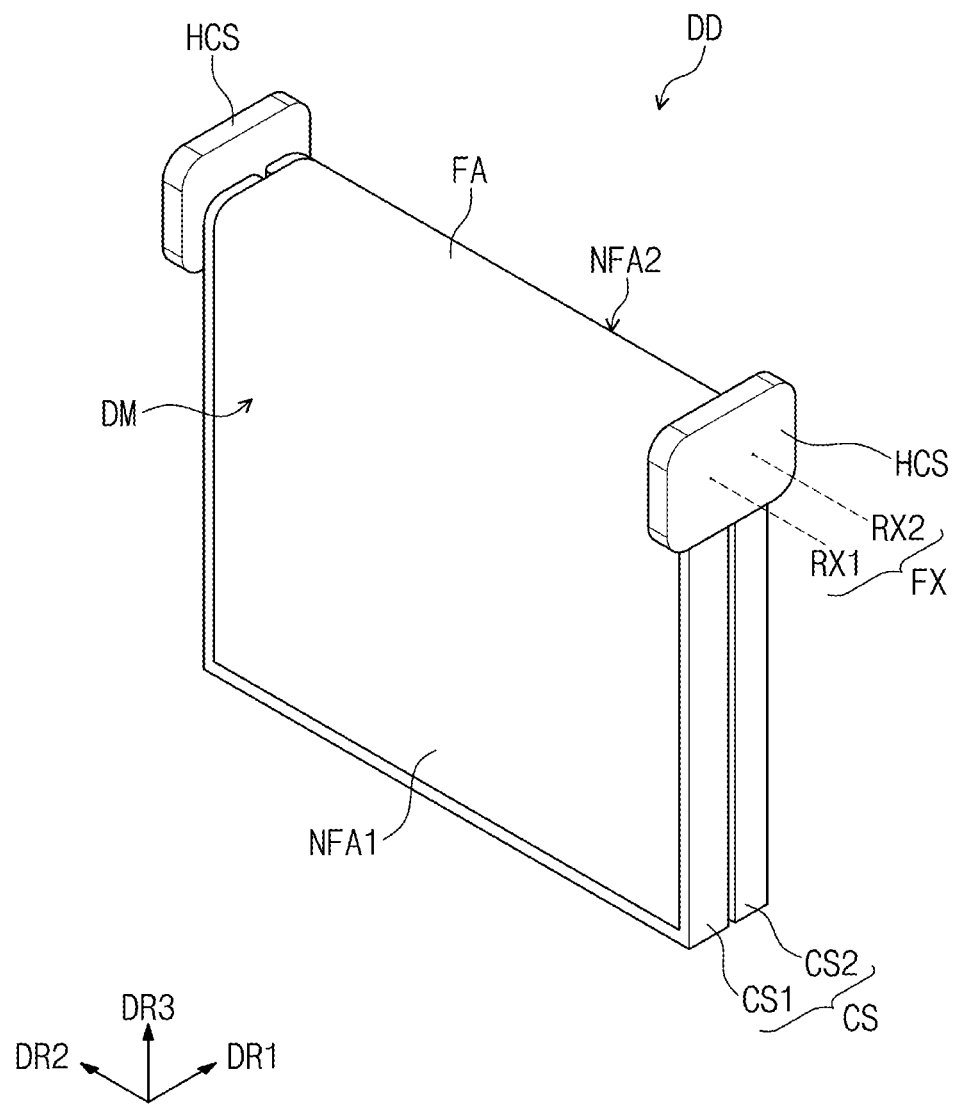
FIG. 6 is a view illustrating a folded state of the display device illustrated in FIG. 5.

FIG. 5 is a view illustrating a configuration of the display device illustrated in FIG. 1. FIG. 6 is a view illustrating a folded state of the display device illustrated in FIG. 5.

Referring to FIGS. 5 and 6, the display device DD may include a display module DM, a case CS, and a plurality of hinge cases HCS. The display module DM may be accommodated in the case CS. The case CS may accommodate a support part for supporting the display module DM, and the hinge cases HCS may accommodate hinges HIG. The hinges may provide the display device DD with a double, rotary axis. The configurations of the hinges and the support part will hereinafter be described in detail in FIG. 7.

The display module DM may have a rectangular shape having long sides extending in the first direction DR1 and short sides extending in the second direction DR2. However, the embodiment of the inventive concept is not limited thereto, and the display module DM may have various shapes such as circles or polygons in another embodiment. The display module DM may be a flexible display module.

The display module DM may include a first non-folding region NFA1, a second non-folding region NFA2, and a folding region FA disposed between the first non-folding region NFA1 and the second non-folding region NFA2. The first non-folding region NFA1, the folding region FA, and the second non-folding region NFA2 may be aligned in the first direction DR1.

The case CS may include a first case CS1 and a second case CS2 which are aligned in the first direction DR1. The first case CS1 and the second case CS2 form a frame shape together, and may accommodate the display module DM. The first case CS1 and the second case CS2 may accommodate the first non-folding region NFA1 and the second non-folding region NFA2, respectively.

The hinge cases HCS may be disposed on both opposite sides of the case CS in the second direction DR2. The hinge cases HCS may be connected to the first case CS1 and the second case CS2. The hinge cases HCS may be adjacent to one side of the first case CS1 and one side of the second case CS2, where the sides of the first and second cases CS1 and CS2 face each other in the first direction DR1. The first case CS1 and the second case CS2 may rotate about a folding axis FX defined in the hinge cases HCS.

In order to provide the display device DD with a double, rotary axis, the folding axis FX may include a first rotary axis RX1 and a second rotary axis RX2 which extend in the second direction DR2 and are spaced apart from each other in the first direction DR1. The folding region FA may overlap the first rotary axis RX1 and the second rotary axis RX2 when viewed in a plan view.

The display device DD may be folded with respect to the first rotary axis RX1 and the second rotary axis RX2. For example, as illustrated in FIG. 6, the first case CS1 and the second case CS2, which are connected to the hinge cases HCS, rotate about the first rotary axis RX1 and the second rotary axis RX2, respectively, and thus, the display device DD may be folded.

The folding region FA is bent as the first case CS1 and the second case CS2 rotate, and thus, the display module DM may be folded. When the display device DD is folded, the display module DM may be out-folded such that the display module DM may be exposed to the outside. When the display device DD is folded, the first non-folding region NFA1 and the second non-folding region NFA2 of the display module DM may be disposed to face opposite directions from each other.

The first case CS1 and the second case CS2 may rotate and be disposed again as illustrated in FIG. 5, and thus, the display device DD may be unfolded. That is, the display module DM may be repeatedly unfolded or folded as illustrated in FIGS. 5 and 6 according to the rotation of the first case CS1 and the second case CS2.

The positions of the first rotary axis RX1 and the second rotary axis RX2 when the display device DD is in the unfolded state may be different from the positions of the first rotary axis RX1 and the second rotary axis RX2, respectively, when the display device DD is in the folded state. Such configurations will be described later in detail.

Figure 7:
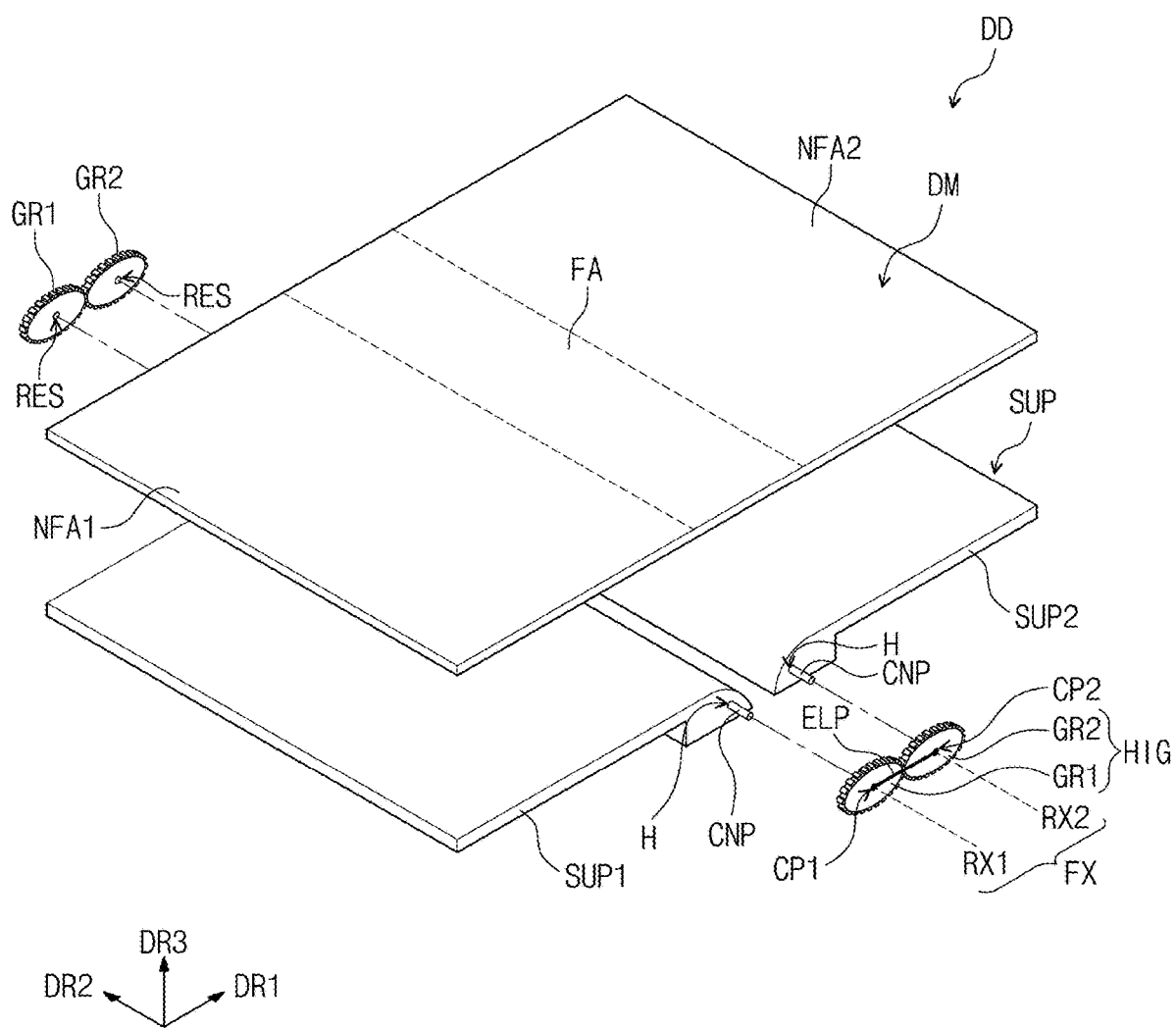
FIG. 7 is an exploded view illustrating parts of the display device which are accommodated in the case and the hinge case that are illustrated in FIG. 5.

FIG. 7 is an exploded view illustrating parts of the display device which are accommodated in the case and the hinge case that are illustrated in FIG. 5.

Referring to FIG. 7, the display device DD may include a display module DM, a support part SUP, a plurality of hinges HIG, and a plurality of connection parts CNP. The support part SUP may be disposed under the display module DM. Two mutually symmetrical hinges HIG may be provided so as to be adjacent to both opposite sides of the support parts SUP, respectively. Two mutually symmetrical hinges HIG may be extended in the second direction DR2. The connection parts CNP may be connected to the support parts SUP.

The display module DM and the support parts SUP may be accommodated in the case CS illustrated in FIG. 5. The hinges HIG may be accommodated in the hinge cases HCS illustrated in FIG. 5.

The support parts SUP may include a first support part SUP1 and a second support part SUP2 which are spaced apart from each other in the first direction DR1. The first support part SUP1 may be disposed under a first non-folding region NFA1. The second support part SUP2 may be disposed under a second non-folding region NFA2. When viewed in a plan view, the first non-folding region NFA1 may overlap the first support part SUP1, and the second non-folding region NFA2 may overlap the second support part SUP2.

One side of the first support part SUP1 and one side of the second support part SUP2 which face each other in the first direction DR1 may each have a curved surface. For example, one side of the first support part SUP1 and one side of the second support part SUP2 may have substantially curved surfaces having mutually symmetrical ¼-circle shapes when viewed in the second direction DR2 (i.e., cross-sectional view). The curved surface on the one side of the first support part SUP1 and the curved surface on the one side of the second support part SUP2 may be disposed so as to overlap a folding region FA and face the folding region FA in the plan view.

The connection parts CNP may extend in the second direction DR2 and be connected to the first support part SUP1 and the second support part SUP2. For example, the connection parts CNP may have a cylindrical shape extending in the second direction DR2. The connection parts CNP may be connected to a portion adjacent to the one side of the first support part SUP1 and to a portion adjacent to the one side of the second support part SUP2, respectively.

Holes H1 may be defined in a portion of the first support SUP1 adjacent to the one side of the first support part SUP1 and a portion of the second support part SUP2 adjacent to the one side of the second support part SUP2. The connection parts CNP may be inserted in the holes H1 and be connected to the first support part SUP1 and the second support part SUP2, respectively.

The hinges HIG may include a plurality of first gears GR1, a plurality of second gears GR2, and a plurality of elastic parts ELP. Specifically, the hinges HIG may each include a first gear GR1, a second gear GR2, and an elastic part ELP. The second gears GR2 may be disposed adjacent to the first gears GR1 in the first direction DR1 and be engaged with the first gears GR1. The elastic parts ELP may connect the first gears GR1 and the second gears GR2 to each other.

The first gears GR1 and the second gears GR2 may be adjacent to one side of the first support part SUP1 and one side of the second support part SUP2, respectively. That is, the first gears GR1 may be adjacent to the one side of the first support part SUP1. The second gears GR2 may be adjacent to the one side of the second support part SUP2.

In an embodiment, the plurality of first gears GR1 may be a pair of first gears GR1, and the plurality of second gears GR2 may be a pair of second gears GR2. The pair of first gears GR1 may be disposed adjacent to both opposite sides of the first support part SUP1 in the second direction DR2, respectively. The pair of second gears GR2 may be disposed adjacent to both opposite sides of the second support part SUP2 in the second direction DR2, respectively. The first and second gears GR1 and GR2 may be connected to the first and second support parts SUP1 and SUP2, and this configuration will be described in detail in FIG. 11.

The first and second gears GR1 and GR2 may each have a shape corresponding to at least a portion of an "elliptical" shape when viewed in the second direction DR2. For example, the first and second gears GR1 and GR2 may have completely elliptical shape as illustrated in FIG. 7. However, the embodiment of the inventive concept is not limited thereto, and the first and second gears GR1 and GR2 may each have a shape corresponding to a portion of an elliptical shape in another embodiment. These shapes of the first and second gears GR1 and GR2 will be described in other embodiments of the inventive concept.

A side surface of each of the first gears GR1 facing the first support part SUP1 in the second direction DR2 may be defined as an inner side surface of the first gear GR1. A side surface of each of the second gears GR2 facing the second support part SUP2 in the second direction DR2 may be defined as the inner side surface of the second gear GR2. A recessed part RES may be defined on each of the inner side surfaces of the first gears GR1 and the second gears GR2.

The side surface of each of the first gears GR1 that does not face the first support part SUP1 may be defined as the outer side surface of the first gear GR1. The outer side surface of the first gear GR1 may be the side surface of the first gear GR1 opposite the inner side surface of the first gear GR1. The side surface of each second gear GR2 that does not face the second support part SUP2 may be defined as the outer side surface of the second gear GR2. The outer side surface of the second gear GR2 may be the side surface of the second gear GR2 opposite the inner side surface of the second gear GR2.

The elastic parts ELP may each connect a pair of the first gear GR1 and the second gear GR2 which engage with each other. For example, the elastic parts ELP may each be connected to the outer side surfaces of the first and second gears GR1 and GR2 which are engaged with each other. Specifically, the elastic parts ELP may each be connected to the central sections of the outer side surfaces of the first and second gears GR1 and GR2.

The elastic parts ELP may include materials having predetermined elasticity. The first and second gears GR1 and GR2 which are engaged with each other may be pulled to each other by the corresponding elastic part ELP among the elastic parts ELP. Thus, the state in which the first and second gears GR1 and GR2 are engaged with each other may be maintained by the elastic part ELP having predetermined elasticity regardless of rotational status of the first and second gears GR1 and GR2.

Hereinafter, when viewed in the second direction DR2, the center of the first gear GR1 corresponding to the center of an elliptical shape is defined as a first center point CP1, and the center of the second gear GR2 corresponding to the center of an elliptical shape is defined as a second center point CP2. The first gear GR1 may rotate about a first rotation axis RX1 that overlaps the first center point CP1 when viewed in the second direction DR2 and extends in the second direction DR2. The second gear GR2 may rotate about a second rotation axis RX2 that overlaps the second center point CP2 when viewed in the second direction DR2 and extends in the second direction DR2.

Figure 8:
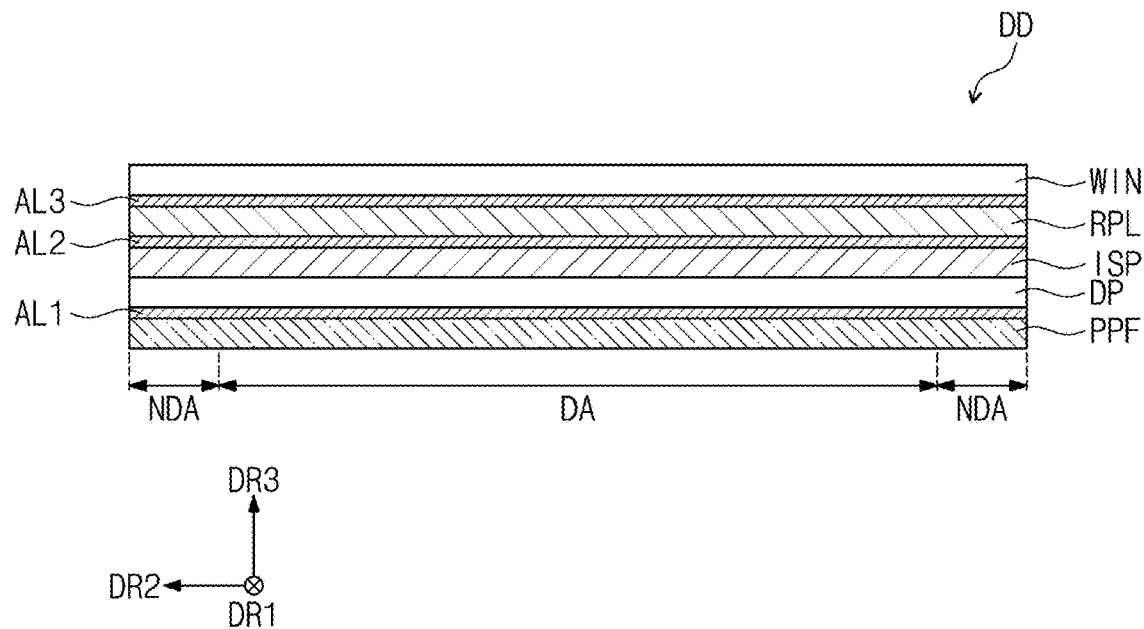
FIG. 8 is a view exemplarily illustrating a cross-section of the display module illustrated in FIG. 7.

FIG. 8 is a view exemplarily illustrating a cross-section of the display module illustrated in FIG. 7.

FIG. 8 exemplarily illustrates a cross-section of a display module DM when viewed in the first direction DR1.

Referring to FIG. 8, the display module DM may include a display panel DP, an input sensing part ISP, a reflection preventing layer RPL, a window WIN, a panel protecting film PPF, and first to third adhesive layers AL1 to AL3. The display panel DP may be a flexible display panel.

The display panel DP according to an embodiment of the inventive concept may be a light-emitting display panel, and the embodiment of the inventive concept is not limited thereto. For example, the display panel DP may be an organic light-emitting display panel or a quantum dot light-emitting display panel in another embodiment. An emission layer of the organic light-emitting display panel may include an organic light-emitting material. The emission layer of the quantum dot light-emitting display panel may include quantum dots, quantum rods and the like. Hereinafter, the display panel DP will be described as an organic light-emitting display panel.

The input sensing part ISP may be disposed on the display panel DP. The input sensing part ISP may sense an external input through an electrostatic capacitive method. The input sensing part ISP may be manufactured directly on the display panel DP when manufacturing the display module DM. However, the embodiment to the inventive concept is not limited thereto, and the input sensing part ISP may also be manufactured as a separate panel and attached to the display panel DP in another embodiment.

The reflection preventing layer RPL may be disposed on the input sensing part ISP. The reflection preventing layer RPL may decrease the reflectivity of the external light incident to the display panel DP from above the display module DM. For example, the reflection preventing layer RPL may include a retarder and/or a polarizer.

The window WIN may be disposed on the reflection preventing layer RPL. The window WIN may protect, from external scratches and shocks, the display panel DP, the input sensing part ISP, and the reflection preventing layer RPL.

The panel protecting film PPF may be disposed under the display panel DP. The panel protecting film PPF may protect a lower portion of the display panel DP. The panel protecting film PPF may contain a flexible plastic material.

The first adhesive layer AL1 may be disposed between the display panel DP and the panel protecting film PPF and cause the display panel DP and the panel protecting film PPF to be joined to each other. The second adhesive layer AL2 may be disposed between the reflection preventing layer RPL and the input sensing part ISP and cause reflection preventing layer RPL and the input sensing part ISP to be joined to each other. The third adhesive layer AL3 may be disposed between the window WIN and the reflection preventing layer RPL and cause the window WIN and the reflection preventing layer RPL to be joined to each other.

Figure 9:
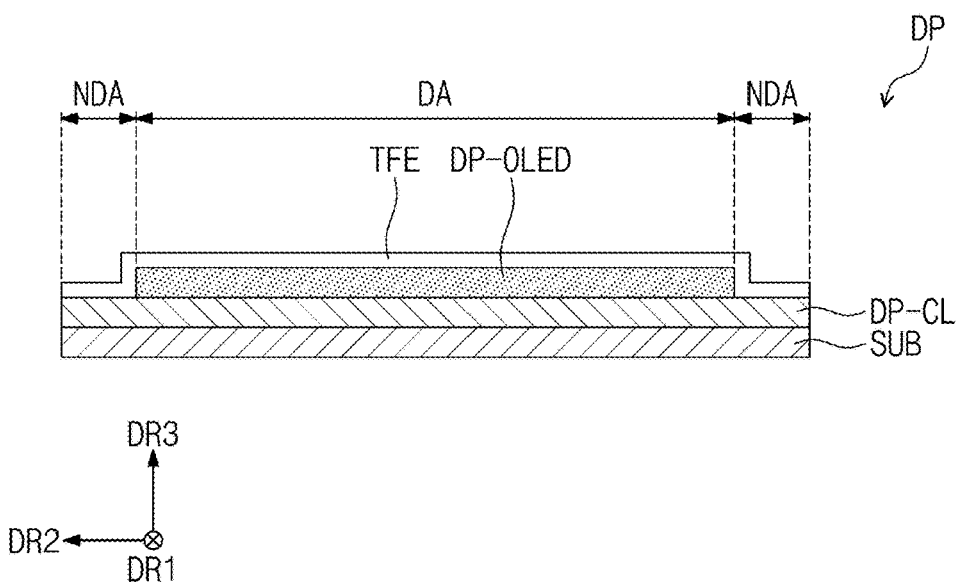
FIG. 9 is a view exemplarily illustrating a cross-section of the display panel illustrated in FIG. 8.

FIG. 9 is a view exemplarily illustrating a cross-section of the display panel illustrated in FIG. 8.

Referring to FIG. 9, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display region DA and a non-display region NDA around the display region DA. The display element layer DP-OLED may overlap the display region DA in the plan view. The substrate SUB may include a flexible plastic material.

A plurality of pixels may be disposed on the circuit element layer DP-CL and the display element layer DP-OLED. The pixels may each include a transistor disposed on the circuit element layer DP-CL and a light-emitting element disposed on the display element layer DP-OLED and connected to the transistor.

The thin-film encapsulation layer TFE may cover the display element layer DP-LED. The thin-film encapsulation layer TFE may include an inorganic layer, an organic layer, and an inorganic layer which are sequentially laminated. The inorganic layers may include an inorganic material and protect the pixels from moisture/oxygen. The organic layer may include an organic material and protect the pixels from foreign substances such as dusts.

Figure 10:
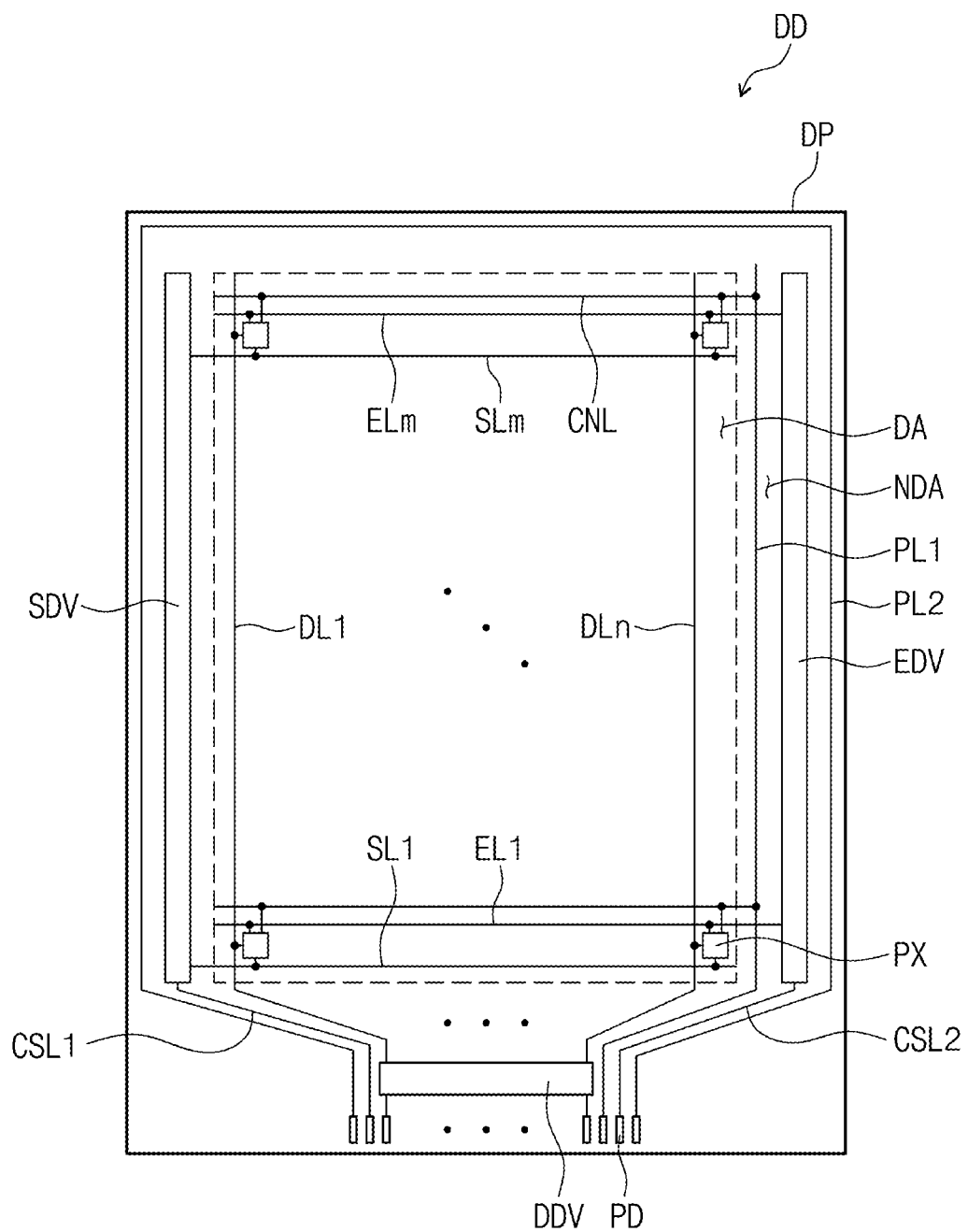
FIG. 10 is a plan view of the display panel illustrated in FIG. 8.

FIG. 10 is a plan view of the display panel illustrated in FIG. 8.

Referring to FIG. 10, a display device DD may include a display panel DP, a scan driver part SDV, a data driver part DDV, an emission driver part EDV, and a plurality of pads PD.

The display panel DP may have a rectangular shape that has long sides extending in the first direction DR1 and short sides extending in the second direction DR2, but the shape of the display panel DP according to the invention is not limited thereto. The display panel DP may include a display region DA and a non-display region NDA surrounding the display region DA.

The display panel DP may include a plurality of pixels PX, a plurality of scan lines SL1-SLm, a plurality of data lines DL1-DLn, a plurality of emission lines EL1-Elm, first and second control lines CSL1 and CSL2, first and second power lines PL1 and PL2, and connection lines CNL. Here, m and n are natural numbers.

The pixels PX may be disposed in the display region DA. The scan drive part SDV and the emission drive part EDV may be disposed on the non-display regions NDA adjacent to the respective long sides of the display panel DP. The data drive part DDV may be disposed in a non-display region NDA adjacent to any one short side among the short sides of the display panel DP. When viewed in a plan view, the data drive part DDV may be adjacent to a lower end of the display panel DP.

The scan lines SL1-SLm may extend in the second direction DR2 and be connected to the pixels PX and the scan drive part SDV. The data lines DL1-DLn may extend in the first direction DR1 and be connected to the pixels PX and the data drive part DDV. The emission lines EL1-ELm may extend in the second direction DR2 and be connected to the pixels PX and the emission drive part EDV. The first power line PL1 may extend in the first direction DR1 and be disposed in the non-display region NDA.

The first power line PL1 may be disposed between the display region DA and the emission drive part EDV, but the embodiment of the inventive concept is not limited thereto, and the first power line may be disposed between the display region DA and the scan drive part SDV in another embodiment.

The connection lines CNL may extend in the second direction DR2 and be aligned in the first direction DR1. The connection lines CNL may be connected to the first power line PL1 and the pixels PX. A first voltage may be applied to the pixels PX through the first power line PL1 and the connection lines CNL which are connected to each other.

The second power line PL2 may be disposed in the non-display region NDA. The second power line PL2 may extend along the long sides of the display panel DP and along another short side of the display panel DP in which the data drive part DDV is not disposed. The second power line PL2 may be disposed closer to the outer periphery than the scan drive part SDV and the emission drive part EDV.

Although not shown, the second power line PL2 may extend toward the display region DA and be connected to the pixels PX. A second voltage having a lower level than the first voltage may be applied to the pixels PX through the second power line PL2.

The first control line CSL1 may be connected to the scan drive part SDV and extend toward the lower end of the display panel DP when viewed in a plan view. The second control line CSL2 may be connected to the emission drive part EDV and extend toward the lower end of the display panel DP when viewed in a plan view. The data drive part DDV may be disposed between the first control line CSL1 and the second control line CSL2.

The pads PD may be disposed on the display panel DP. The pads PD may be more adjacent to the lower end of the display panel DP than the data drive part DDV. The data drive part DDV, the first power line PL1, the second power line PL2, the first control line CSL1, and the second control line CSL2 may be connected to the pads PD. The data lines DL1-DLn may be connected to the data drive part DDV and the data drive part DDV may be connected to the pads PD corresponding to the data lines DL1-DLn.

Although not shown, the display device DD may further include: a timing controller for controlling the operations of the scan drive part SDV, the data drive part DDV, and the emission drive part EDV; and a voltage generation part for generating the first and second voltages. The timing controller and the voltage generation part may be connected to the corresponding pads PD through a printed circuit board.

The scan drive part SDV may generate a plurality of scan signals and the scan signals may be applied to the pixels PX through the scan lines SL1-SLm. The data drive part DDV may generate a plurality of data signals and the data signals may be applied to the pixels PX through the data lines DL1-DLn. The emission drive part EDV may generate a plurality of light-emitting signals and the light-emitting signals may be applied to the pixels PX through the emission lines EL1-Elm.

The pixels PX may respond to the scan signals to receive data voltages. The pixels PX may respond to the light-emitting signals and display an image by emitting light with luminosity corresponding to the data voltages. The emission time of the pixels PX may be controlled by the light-emitting signals.

Figure 11:
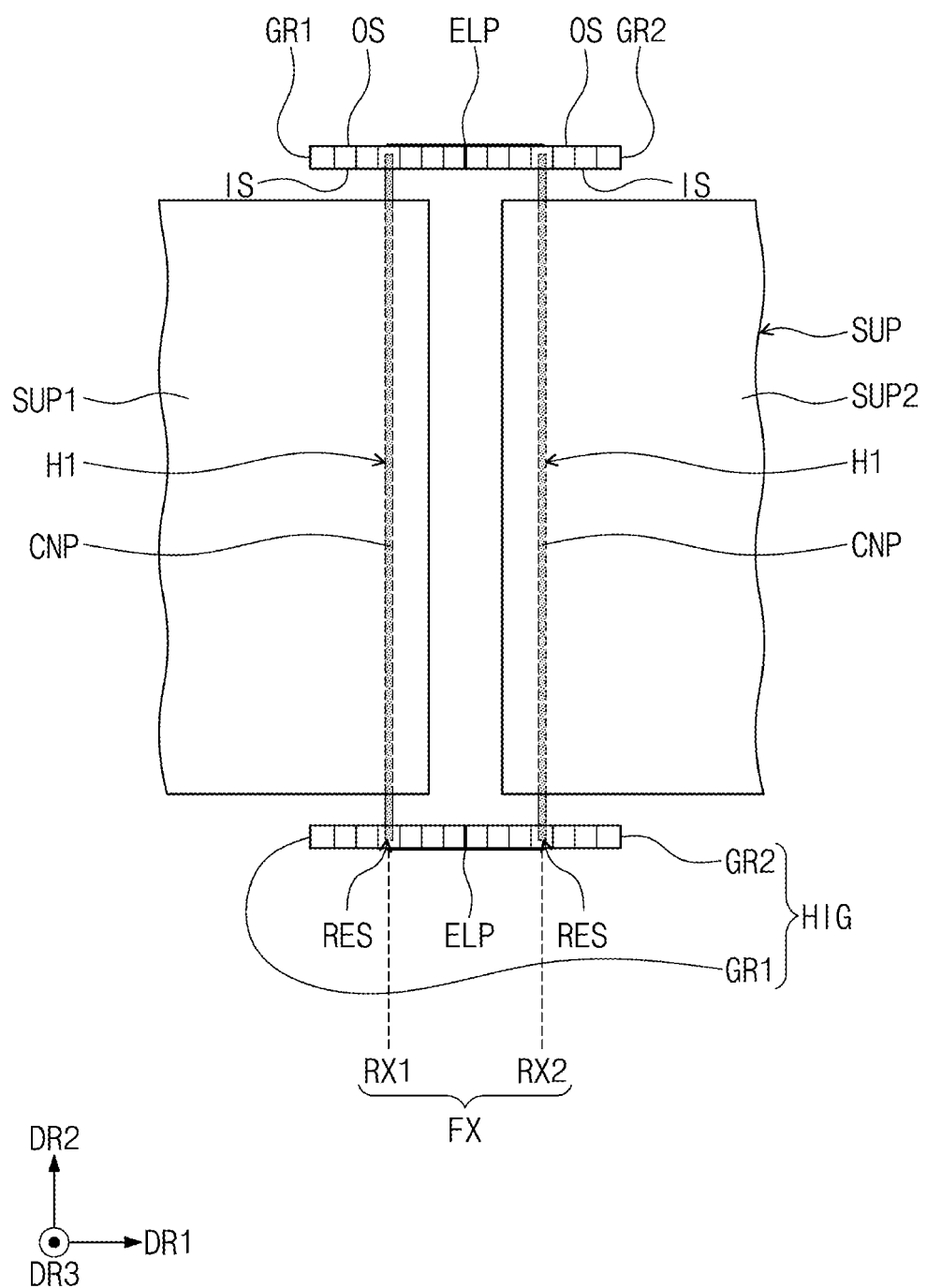
FIG. 11 is a view illustrating a connected state of the hinge and support part which are illustrated in FIG. 7.

FIG. 11 is a view illustrating a connected state of the hinges and support part which are illustrated in FIG. 7.

FIG. 11 exemplarily illustrates a plan view of the hinges HIG and the support part SUP when viewed in the third direction DR3.

Referring to FIG. 11, holes H1 extending in the second direction DR2 may be defined in a portion of the first support SUP1 adjacent to the one side of the first support part SUP1, and in a portion of the second support part SUP2 adjacent to the one side of the second support part SUP2, respectively. The connection parts CNP may be inserted into the holes H1. Both ends of the connection parts CNP may be exposed to the outside of the first support part SUP1 and to the outside of the second support part SUP2.

The first gears GR1 may be disposed adjacent to both sides of the first support part SUP1 that are opposite each other in the second direction DR2, respectively, and may be connected to both the sides of the first support part SUP1, respectively. The second gears GR2 may be disposed adjacent to both sides of the second support part SUP2 that are opposite each other in the second direction DR2, respectively, and may be connected to both the sides of the second support part SUP2, respectively.

In an embodiment, for example, both ends of the connection parts CNP may be inserted into recessed parts RES defined in the inner side surfaces IS of the first gears GR1 and the inner side surfaces IS of the second gears GR2. The first and second gears GR1 and GR2 may be connected to the first and second support parts SUP1 and SUP2 by means of the connection parts CNP, respectively. The first rotation axis RX1 and the second rotation axis RX2 may be disposed on the same line as the connection parts CNP extend. The connection parts CNP may operate as the rotation axes of the first and second support parts SUP1 and SUP2.

One elastic part ELP among the elastic parts ELP may be disposed on the outer side surfaces OS of one pair of first and second gears GR1 and GR2 which engage with each other, and may connect the one pair of first and second gears GR1 and GR2 which engage with each other. The other elastic part ELP among the elastic parts ELP may be disposed on the outer side surfaces OS of the other pair of first and second gears GR1 and GR2 which engage with each other, and may connect the other pair of first and second gears GR1 and GR2 which engage with each other.

The one pair of first and second gears GR1 and GR2, which engage with each other, and the other pair of first and second gears GR1 and GR2, which engage with each other, may be connected to each other by means of the connection parts CNP. Thus, an attractive force may be generated by the elastic parts ELP in a direction in which the first gears GR1 and the second gears GR2 become close to each other. In addition, an attractive force may be generated by the elastic parts ELP in a direction in which the connection parts CNP connected to the first gears GR1 and the second gears GR2 become close to each other.

Although not shown, the first case CS1 may be disposed in a space between the first gear GR1 and the first support part SUP1, and the second case CS2 may be disposed in a space between the second gear GR2 and the second support part SUP2. The connection parts CNP may pass through the first and second cases CS1 and CS2 and be connected to the first and second gears GR1 and GR2.

Figure 12:
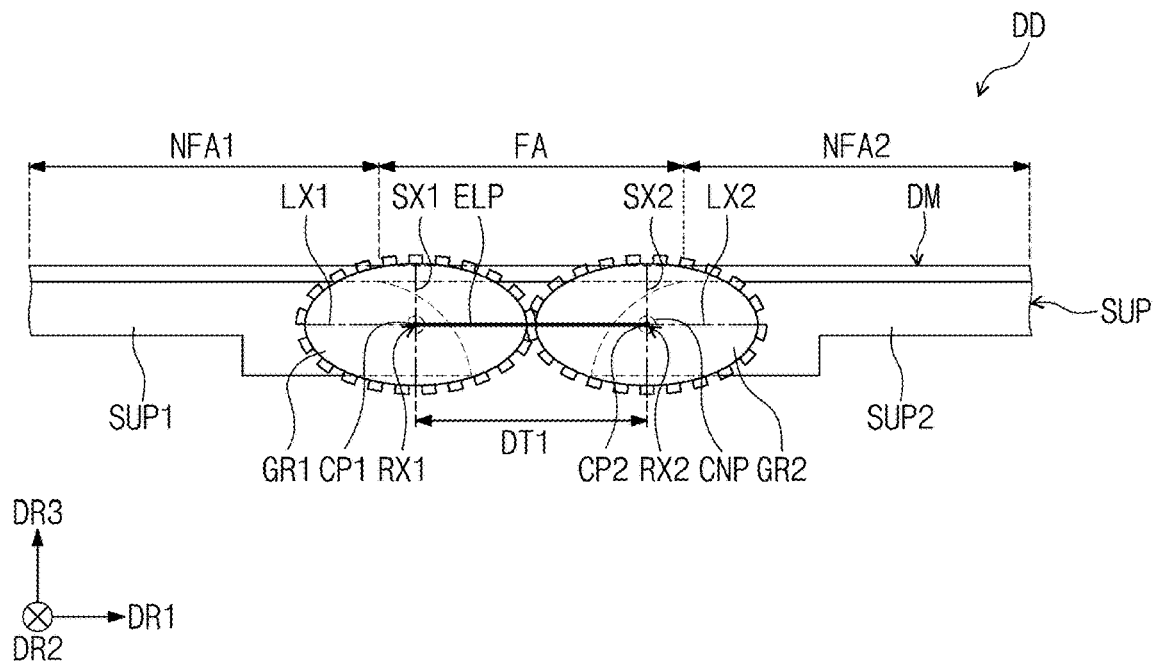
FIG. 12 is a view illustrating side surfaces of first and second gears connected to first and second support parts.
Figure 13:
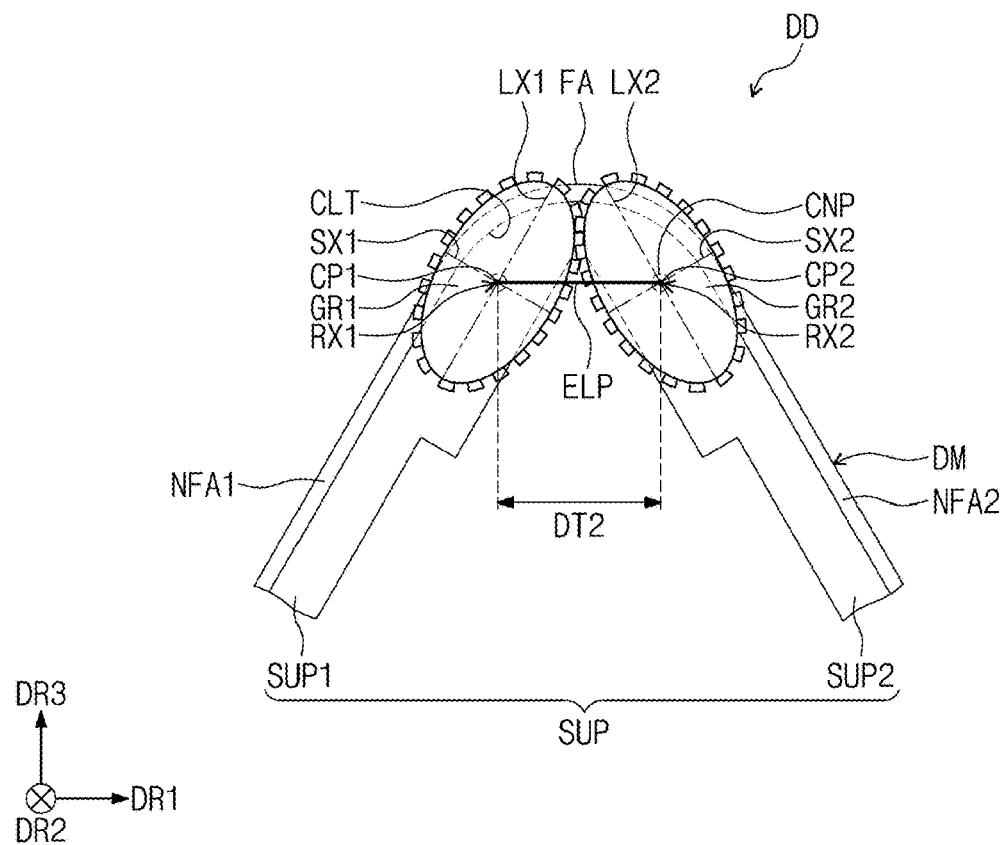
FIGS. 13 and 14 are views illustrating side surfaces of first and second gears rotated so that a display module is folded.
Figure 14:
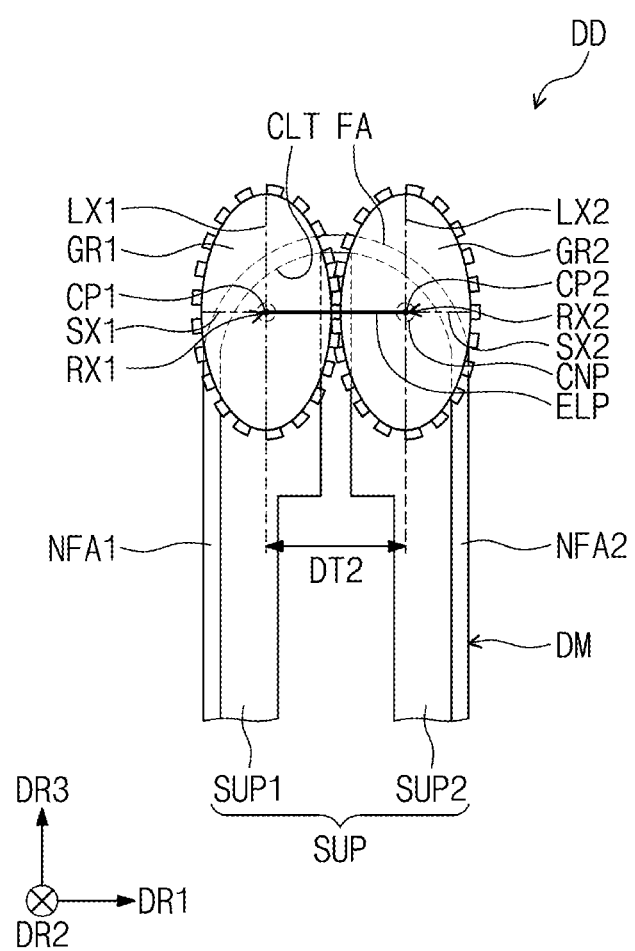

FIG. 12 is a view illustrating side surfaces of the first and second gears GR1 and GR2 connected to first and second support parts SUP1 and SUP2. FIGS. 13 and 14 are views illustrating side surfaces of first and second gears rotated such that a display module is folded.

FIGS. 12, 13 and 14 exemplarily illustrate the side surfaces of the first and second support parts SUP1 and SUP2 and the first and second gears GR1 and GR2 when viewed in the second direction DR2.

Referring to FIG. 12, the first and second gears GR1 and GR2 are disposed adjacent to each other in the first direction DR1 and may have elliptical shapes when viewed in the second direction DR2. The elliptical shapes of the first and second gears GR1 and GR2 may have long axes (e.g., major axis) parallel to the first direction DR1 in the unfolded status.

The rim of the first gear GR1 and the rim of the second gear GR2 may have a plurality of protrusions. The first gear GR1 and the second gear GR2 may rotate relative to each other while the protrusions of the first gears GR1 and the protrusions of the second gear GR2 engage with each other.

The first gear GR1 may include a first long axis LX1 corresponding to the major axis of the elliptical shape, a first short axis SX1 corresponding to the minor axis of the elliptical shape, and a first center point CP1 corresponding to the center of the elliptical shape. The second gear GR2 may include a second long axis LX2 corresponding to the major axis of the elliptical shape, a second short axis SX2 corresponding to the minor axis of the elliptical shape, and a second center point CP2 corresponding to the center of the elliptical shape.

The first and second long axes LX1 and LX2 and the first and second short axes SX1 and SX2 are exemplarily illustrated inside the first and second gears GR1 and GR2 as alternated long and short dash lines. However, some alternated long and short dashed lines of the first and second long axes LX1 and LX2 may not be seen in the drawing due to the elastic part ELP.

The thickness of a portion of the first support part SUP1 adjacent to one side of the first support part SUP1 having a curved surface may be greater than the thickness of a portion of the first support part SUP1 adjacent to the other side of the first support part SUP1. The one side of the first support part SUP1 and the other side of the first support part SUP1 may be both sides of the first support part SUP1 which are opposite each other in the first direction DR1. In this specification, the thickness may mean a numerical value measure in the third direction DR3.

The thickness of a portion of the second support part SUP2 adjacent to one side of the second support part SUP2 having a curved surface may be greater than the thickness of a portion of the second support part SUP2 adjacent to the other side of the second support part SUP2. The one side of the second support part SUP2 and the other side of the second support part SUP2 may be both sides of the second support part SUP2 which are opposite each other in the first direction DR1.

An unfolded display module DM may be in a state of being unfolded so as to be parallel to the first direction DR1. When the display module DM is an unfolded state, the first long axis LX1 and the second long axis LX2 may be disposed on the same line and parallel to the first direction DR1.

When the display module DM is in the unfolded state, the distance in the first direction DR1 between the first center point CP1 of the first gear GR1 and the second center point CP2 of the second gear GR2 may be defined as a first distance DT1. The first distance DT1 may be defined as the distance between the first center point CP1 and the second center point CP2 when the first long axis LX1 and the second long axis LX2 are disposed on the same line.

Referring to FIGS. 13 and 14, in order to fold a display device DD, the first gear GR1 and the second gear GR2 may rotate about the first rotation axis RX1 and the second rotation axis RX2, respectively. The first gear GR1 may rotate counterclockwise about the first rotation axis RX1. The second gear GR2 may rotate clockwise about the second rotation axis RX2.

The first gear GR1 and the second gear GR2 may be connected to the first support part SUP1 and the second support part SUP2, respectively, through the connection parts CNP. Thus, according to the rotations of the first gear GR1 and the second gear GR2, the first support part SUP1 and the second support part SUP2 may also rotate about the first rotation axis RX1 and the second rotation axis RX2, respectively.

As the first support part SUP1 and the second support part SUP2 rotate, the folding region FA is bent, and the first non-folding region NFA1 and the second non-folding region NFA2 are disposed so as to be opposite each other, and thus, the display module DM may be folded. Thus, the display module DM may be out-folded so as to be exposed to the outside.

The folded state of the display module DM may be defined as a state in which the unfolded display module DM is bent by an angle smaller than about 180 degrees about the folding region.

Referring to FIG. 13, in order that the unfolded display module DM is not completely folded, the first support part SUP1 and the second support part SUP2 may rotate with respect to the first direction DR1 by a small angle greater than about 0 degree and smaller than about 90 degrees. For example, in order to fold the display module DM, the first support part SUP1 and the second support part SUP2 may rotate, as illustrated in FIG. 13, by about 50 degrees with respect to the first direction DR1.

Referring to FIG. 14, in order that the unfolded display module DM is completely folded, the first support part SUP1 and the second support part SUP2 may rotate with respect to the first direction DR1 by an angle of about 90 degrees. In this case, the first and second non-folding regions NFA1 and NFA2 of the folded display module DM may be disposed so as to be spaced apart from each other in the first direction and parallel to the third direction DR3. When the display module DM is in a completely folded state, the first short axis SX1 and the second short axis SX2 may be disposed on the same line and be parallel to the first direction DR1.

When the display module DM is completely folded, one side of the first support part SUP1 and one side of the second support part SUP2 may be adjacent to each other and substantially form a semicircular shape. For example, when viewed in the second direction DR2, one side of the first support part SUP1 and one side of the second support part SUP2 may form a semicircular shape together. One side of the first support part SUP1 having a ¼ circle shape (i.e., a quarter circle shape) and one side of the second support part SUP2 having a ¼ circle shape may be adjacent to each other and form a semicircular shape.

The elastic part ELP may be disposed parallel to the first direction DR1 and connected to the first center point CP1 of the outer side surface of the first gear GR1 and to the second center point CP2 of the outer side surface of the second gear GR2. The elastic part ELP may maintain a state parallel to the first direction DR1 even when the display device DD is folded.

Referring to FIGS. 13 and 14, when the display module DM is in a folded state, the distance in the first direction DR1 between the first center point CP1 and the second center point CP2 may be defined as a second distance DT2. Specifically, the second distance DT2 may be defined as the distance between the first center point CP1 and the second center point CP2 when the display module DM is not completely folded as illustrated in FIG. 13, and when the display module DM is completely folded as illustrated in FIG. 14.

When the display module DM is completely folded, the second distance DT2 may be defined as the distance between the first center point CP1 and the second center point CP2 in a state in which the first short axis SX1 and the second short axis SX2 are disposed on the same line.

The first distance DT1 may be defined as the distance between the first rotation axis RX1 and the second rotation axis RX2 when the display module DM is in an unfolded state. The second distance DT2 may be defined as the distance between the first rotation axis RX1 and the second rotation axis RX2 when the display module DM is in a folded state. Specifically, the second distance DT2 may be defined as the distance between the first center point CP1 and the second center point CP2 when the display module DM is not completely folded as illustrated in FIG. 13, and when the display module DM is completely folded as illustrated in FIG. 14.

Since the first gear GR1 and the second gear GR2 have elliptical shapes, the positions of the first rotation axis RX1 and the second rotation axis RX2 when the display module DM is in a folded state may be different from the positions of the first rotation axis RX1 and the second rotation axis RX2, respectively, when the display module DM is in an unfolded state. That is, the second distance DT2 may be different from the first distance DT1.

In an embodiment of the present invention, the first distance DT1 may be greater than the second distance DT2. Thus, the first support part SUP1 and the second support part SUP2, which are connected to the first gear GR1 and the second gear GR2, move so as to be farther from each other when the display module DM is unfolded, and may move so as to be closer to each other when the display module DM is folded.

When the display module DM is unfolded, the first support part SUP1 and the second support part SUP2 become farther from each other, and thus, the bent folding region FA may be more flatly unfolded. When the display module DM is folded, the first support part SUP1 and the second support part SUP2 become closer to each other, and thus, the folding region FA may be more easily folded.

The display module DM may be folded while the first and second rotation axes RX1 and RX2 illustrated in FIG. 12 do not move to the positions illustrated in FIGS. 13 and 14 and are fixed to the position illustrated in FIG. 12. In this case, when the display module DM is folded, a tensile force is generated in the folding region FA and stress may be generated in the folding region FA. Thus, the folding region FA is deformed by the stress or the elements disposed in the folding region FA may be damaged.

However, in an embodiment of the inventive concept, when the display module DM is folded, the first and second rotation axes RX1 and RX2 move so as to be closer to each other, so that stress may not be generated in the folding region FA. Thus, the deformation of the folding region FA may be prevented, and the folding region FA may be more easily folded.

For example, the first distance DT1 may be smaller than or equal to the curved surface length CLT of the bent folding region FA illustrated in FIG. 14. But the embodiment of the inventive concept is not limited thereto, and when the display module DM is unfolded, the first distance DT1 may be greater than the curved surface distance CLT of the bent folding region FA such that the folding region FA may be more flatly unfolded. For example, the first distance DT1 may be greater than the curved surface length CLT by the about 1/10 to about 1/20 of the curved surface length CLT.

The curved surface length CLT of the bent folding region FA may be defined as the curved surface length of a lower surface of the folding region FA that faces one side of the first support part SUP1 and one side of the second support part SUP2 each having a curved surface. In addition, the curved surface length CLT may be defines as the curved surface length of the lower surface of the folding region FA when viewed in the second direction DR2.

Hereinafter, in other embodiments of the inventive concept, the folding state of a display device is illustrated in a completely folded state similar to FIG. 14. However, the embodiment of the inventive concept is not limited thereto, and other embodiments of the inventive concept to be described below may include a state of not being completely folded as illustrated in FIG. 13.

Figure 15:
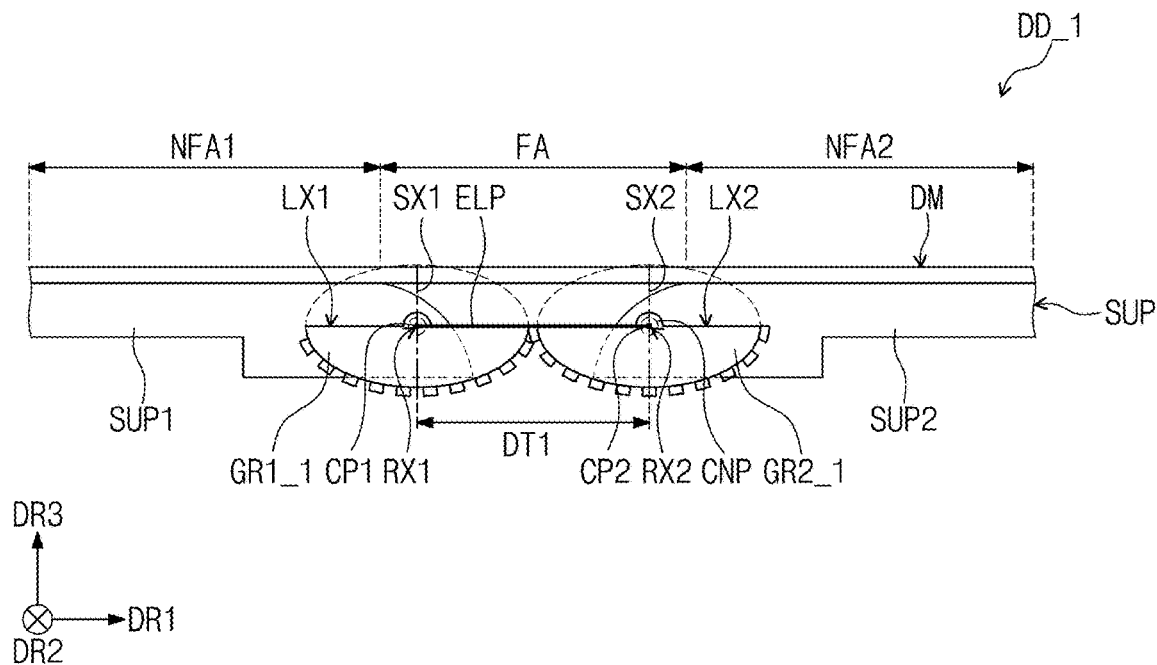
FIG. 15 is a view illustrating a configuration of a display device according to another embodiment of the inventive concept.
Figure 16:
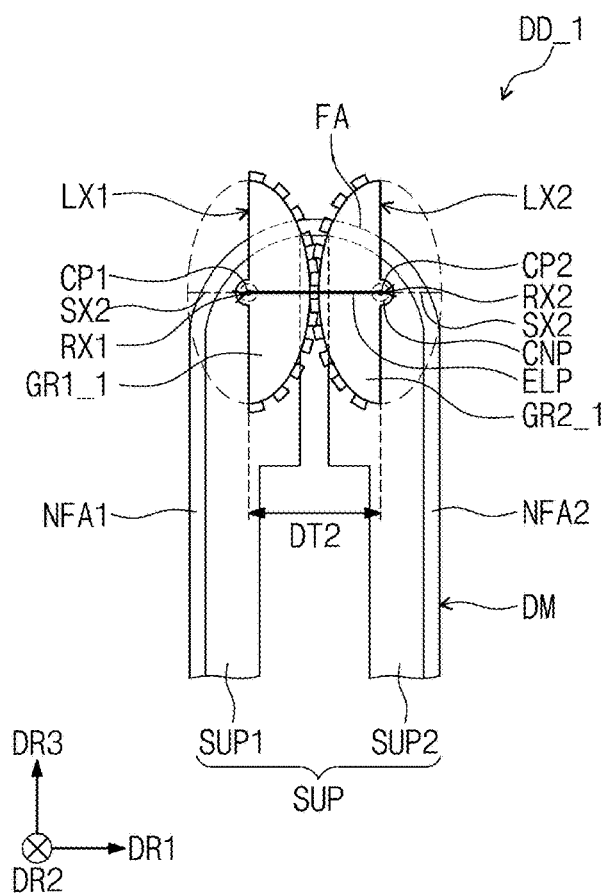
FIG. 16 is a view illustrating a folded state of the display device illustrated in FIG. 15.

FIG. 15 is a view illustrating a configuration of a display device according to another embodiment of the inventive concept. FIG. 16 is a view illustrating a folded state of the display device illustrated in FIG. 15.

FIGS. 15 and 16 exemplarily illustrate side surfaces corresponding to FIGS. 12 and 14, and the same configurations are illustrated using the same reference symbol. Hereinafter, the configurations of a display device DD-1 illustrated in FIGS. 15 and 16 will be described mainly on the configuration different from that of the display devices DD illustrated in FIGS. 12 and 14.

Referring to FIGS. 15 and 16, a first gear GR1-1 and a second gear GR2-1 may each have a shape corresponding to at least a portion of an elliptical shape when viewed in the second direction DR2. For example, the first gear GR1-1 and the second gear GR2-1 may each have a ½ elliptical shape (i.e., a half elliptical shape) that is divided with respect to the major axis of the elliptical shape. The first gear GR1_1 and the second gear GR2_1 may have shapes symmetrical to each other.

In an embodiment, for example, the first gear GR1-1 and the second gear GR2-1 may each have a ½ elliptical shape corresponding to a lower portion of the elliptical shape when dividing the elliptical shape by the major axis. Thus, the first gear GR1_1 and the second gear GR2_1 may each have a downwardly convex curved surface.

When it is assumed that the first gear GR1_1 has an elliptical shape, the first center point CP1 of the first gear GR1_1 may be defined as the center point of the elliptical shape. The second center point CP2 of the second gear GR2_1 may be defined as the center point of an elliptical shape when assuming that the second gear GR2_1 has an elliptical shape.

The first gear GR_1 and the second gear GR2_1 may rotate about a first rotational axis RX1 and a second rotational axis RX2 while engaging with each other. Consequently, the display module DM may be folded. Even when the first gear GR_1 and the second gear GR2_1 do not have completely elliptical shapes, the folding operation of the display device DD-1 may be easily performed as illustrated in FIGS. 15 and 16.

Other configurations of the display device DD-1 may substantially be the same as the configurations of the display devices DD illustrated in FIGS. 12 and 14, and thus, the description thereon will be omitted.

Figure 17:
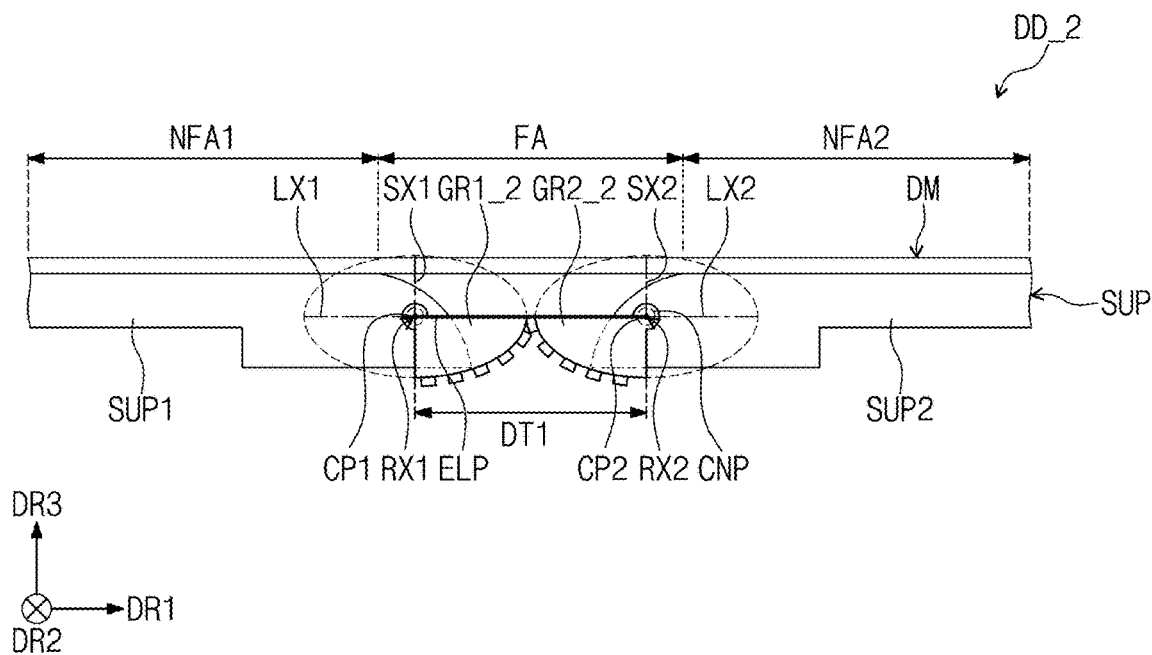
FIG. 17 is a view illustrating a configuration of a display device according to another embodiment of the inventive concept.
Figure 18:
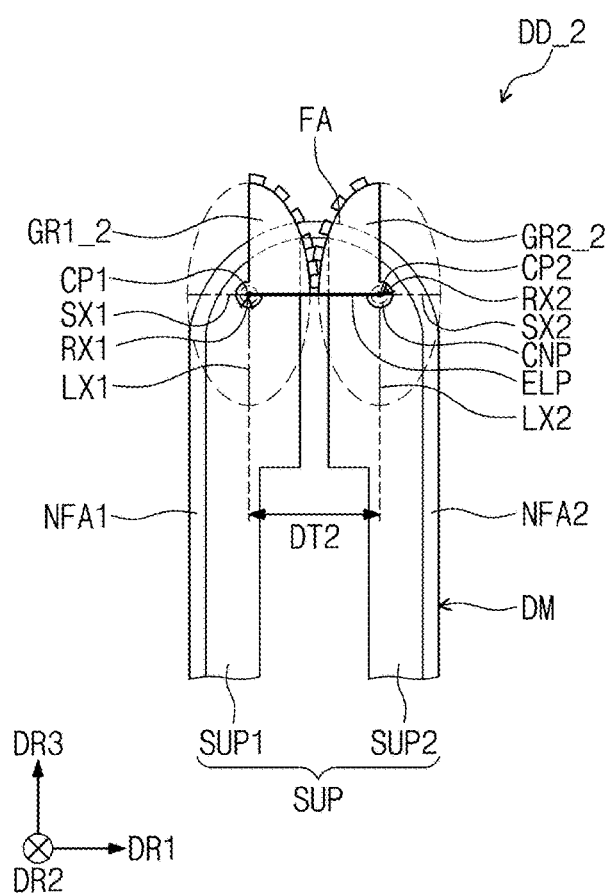
FIG. 18 is a view illustrating a folded state of the display device illustrated in FIG. 17.

FIG. 17 is a view illustrating a configuration of a display device according to another embodiment of the inventive concept. FIG. 18 is a view illustrating a folded state of the display device illustrated in FIG. 17.

FIGS. 17 and 18 exemplarily illustrate side surfaces corresponding to FIGS. 12 and 14, and the same configurations are illustrated using the same reference symbols. Hereinafter, the configurations of the display device DD_2 illustrated in FIGS. 17 and 18 will be described mainly on the configuration different from that of the display devices DD illustrated in FIGS. 12 and 14.

Referring to FIGS. 17 and 18, a first gear GR1-2 and a second gear GR2-2 may each have a shape corresponding to at least a portion of an elliptical shape when viewed in the second direction DR2. For example, the first gear GR1-2 and the second gear GR2-2 may each have a ¼ elliptical shape (i.e., a quarter elliptical shape) that is divided with respect to the major axis and the minor axis of the elliptical shape.

In an embodiment, for example, the first gear GR1_2 may have a ¼ elliptical shape corresponding to the right lower portion of the elliptical shape when dividing the elliptical shape with respect to the major axis and the minor axis thereof. The second gear GR2_2 may have a ¼ elliptical shape corresponding to the left lower portion of the elliptical shape when dividing the elliptical shape with respect to the major axis and the minor axis thereof.

The curved surfaces of the first gear GR1_2 and the second gear GR2_2 may be disposed so as not to face the folding region FA. The first center point CP1 of the first gear GR1_2 may be defined as the center point of the elliptical shape, and the second center point CP2 of the second gear GR2_2 may be defined as the center point of the elliptical shape.

The first gear GR1_2 and the second gear GR2_2 may rotate about a first rotational axis RX1 and a second rotational axis RX2, respectively, while engaging with each other, and thus, the display module DM may be folded. Even when the first gear GR1_2 and the second gear GR2_2 do not have completely elliptical shapes, the folding operation of the display device DD_2 may be easily performed as illustrated in FIGS. 17 and 18.

Figure 19:
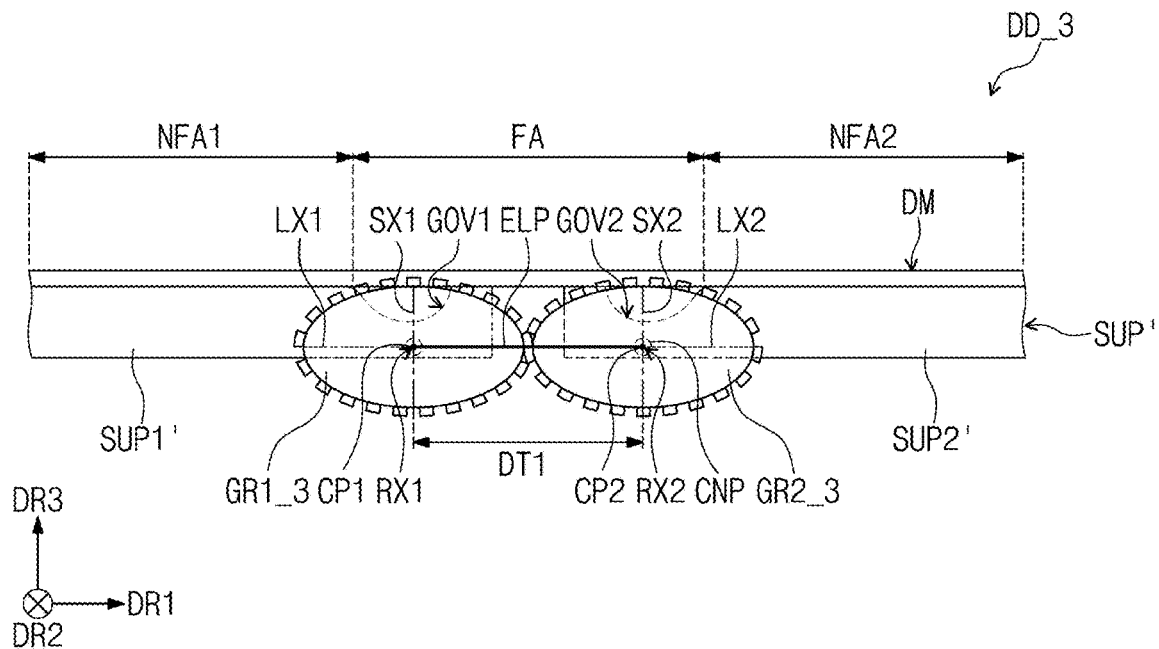
FIG. 19 is a view illustrating a configuration of a display device according to another embodiment of the inventive concept.
Figure 20:
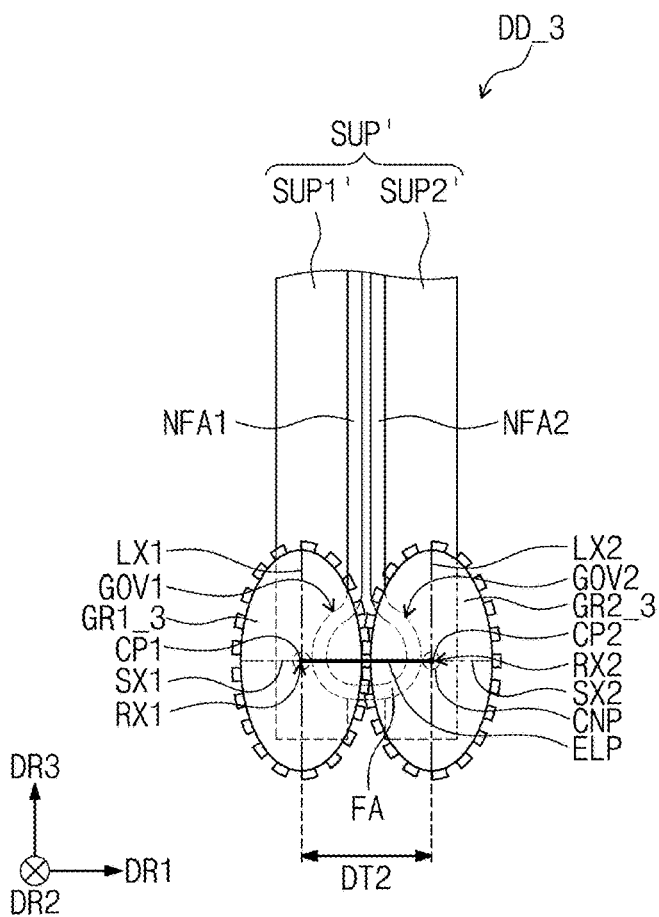
FIG. 20 is a view illustrating a folded state of the display device illustrated in FIG. 19.

FIG. 19 is a view illustrating a configuration of a display device according to another embodiment of the inventive concept. FIG. 20 is a view illustrating a folded state of the display device illustrated in FIG. 19.

FIGS. 19 and 20 exemplarily illustrate side surfaces corresponding to FIGS. 12 and 14, and the same configurations are illustrated using the same reference symbols. Hereinafter, the configurations of the display device DD_3 illustrated in FIGS. 19 and 20 will be described mainly on the configuration different from that of the display devices DD illustrated in FIGS. 12 and 14.

Referring to FIGS. 19 and 20, the display device DD_3 may include a support part SUP' that is disposed under a display module DM and supports the display module DM. The support part SUP' may include a first support part SUP1' and a second support part SUP2' which are spaced apart from each other in the first direction DR1.

First gears GR1_3 and second gears GR2_3 may be adjacent to one side of the first support part SUP1' and one side of the second support part SUP2', respectively. In addition, the first gears GR1_3 and the second gears GR2_3 may respectively be adjacent to a lower surface of the first support part SUP1' and a lower surface of the second support part SUP2'.

A first groove GOV1 may be defined on the upper surface of the first support part SUP1' adjacent to one side of the first support part SUP1' that faces the second support part SUP2' in the first direction DR1. A second groove GOV2 may be defined on the upper surface of the second support part SUP2' adjacent to one side of the second support part SUP2' that faces the first support part SUP1' in the first direction DR1. The first groove GOV1 and the second groove GOV2 may each have a concave curved surface.

The first gear GR1_3 may be disposed between the lower surface of the first support part SUP1' and the first groove GOV1. The second gear GR2_3 may be disposed between the lower surface of the second support part SUP2' and the second groove GOV2.

The first gear GR1_3 and the second gear GR2_3 may be connected to the first support part SUP1' and the second support part SUP2', respectively, by means of the connection parts CNP. The configuration in which the first gear GR1_3 and the second gear GR2_3 are connected to the first support part SUP1' and the second support part SUP2', respectively, are substantially the same as the configuration illustrated in FIG. 12 in which the first gear GR1 and the second gear GR2 are connected to the first support part SUP1 and the second support part SUP2, respectively, and thus, descriptions thereon will be omitted.

The display module DM may be disposed on the first support part SUP1' and the second support part SUP2'. A first non-folding region NFA1 may overlap the first support part SUP1', and a second non-folding region NFA2 may overlap the second support part SUP2' in the plan view. The folding region FA may be disposed on the first groove GOV1 and the second groove GOV2.

The first gear GR1_3 and the second gear GR2_3 may each have an elliptical shape when viewed in the second direction DR2. The first gear GR1_3 and the second gear GR2_3 may have substantially the same configuration as the first gear GR1 and the second gear GR2 illustrated in FIG. 12.

The first gear GR1_3 may rotate about a first rotation axis RX1 that overlaps the first center point CP1 of the first gear GR1_3 when viewed in the second direction DR2. The second gear GR2_3 may rotate about a second rotation axis RX2 that overlaps the second center point CP2 of the second gear GR2_3 when viewed in the second direction DR2. The first gear GR1_3 may rotate clockwise about the first rotation axis RX1. The second gear GR2_3 may rotate counterclockwise about the second rotation axis RX2.

As the first gear GR1_3 and the second gear GR2_3 rotate, the first support part SUP1' and the second support part SUP2' may also rotate about the first rotation axis RX1 and the second rotation axis RX2, respectively. As the first support part SUP_1' and the second support part SUP2' rotate, the folding region FA is bent, and the first non-folding region NFA1 and the second non-folding region NFA2 are disposed to face each other, and thus, the display module DM may be folded. Thus, the display module DM may be in-folded such that the display module DM is not exposed to the outside.

When the display module DM is folded, the first groove GOV1 and the second groove GOV2 may be adjacent to each other and form an approximately circular shape. The bent folding region FA may be disposed on the first groove GOV1 and the second groove GOV2 which form a circular shape.

The display device DD illustrated in FIGS. 12 and 14 may be an out-folding display device and the display device DD_3 illustrated in FIGS. 19 and 20 may be an in-folding device. Like the display device DD, in the display device DD_3, the first distance DT1 between the first center point CP1 and the second center point CP2 when the display module DM is in an unfolded state may be greater than the second distance DT2 between the first center point and the second center point when the display module DM is in a folded state.

Figure 21:
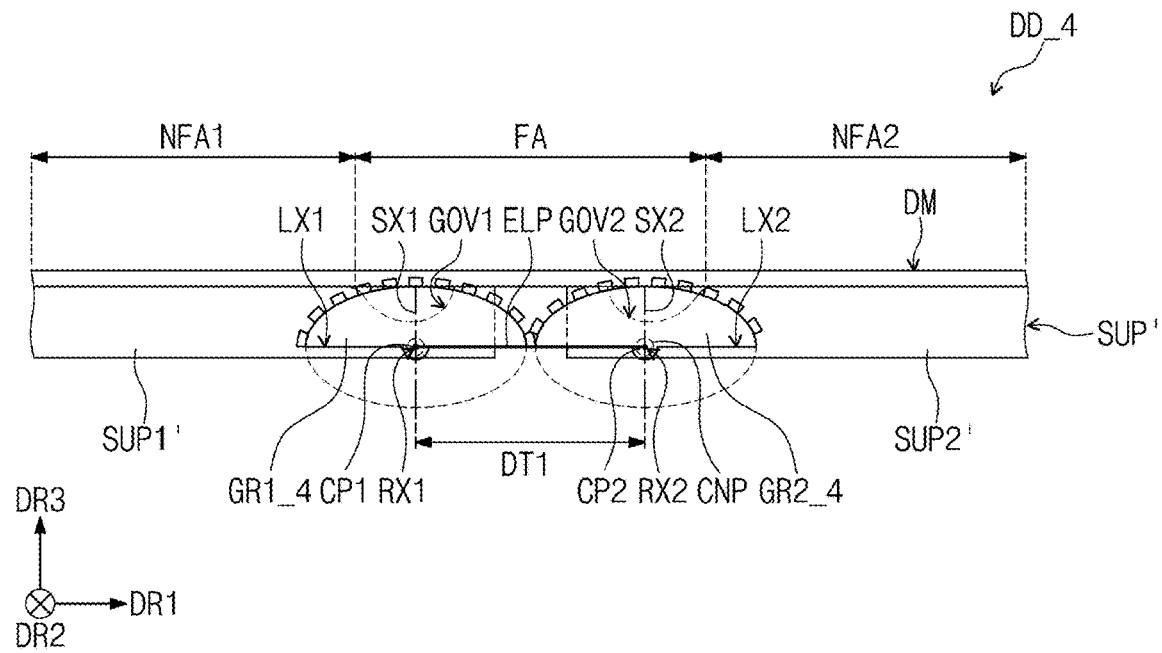
FIG. 21 is a view illustrating a configuration of a display device according to another embodiment of the inventive concept.
Figure 22:
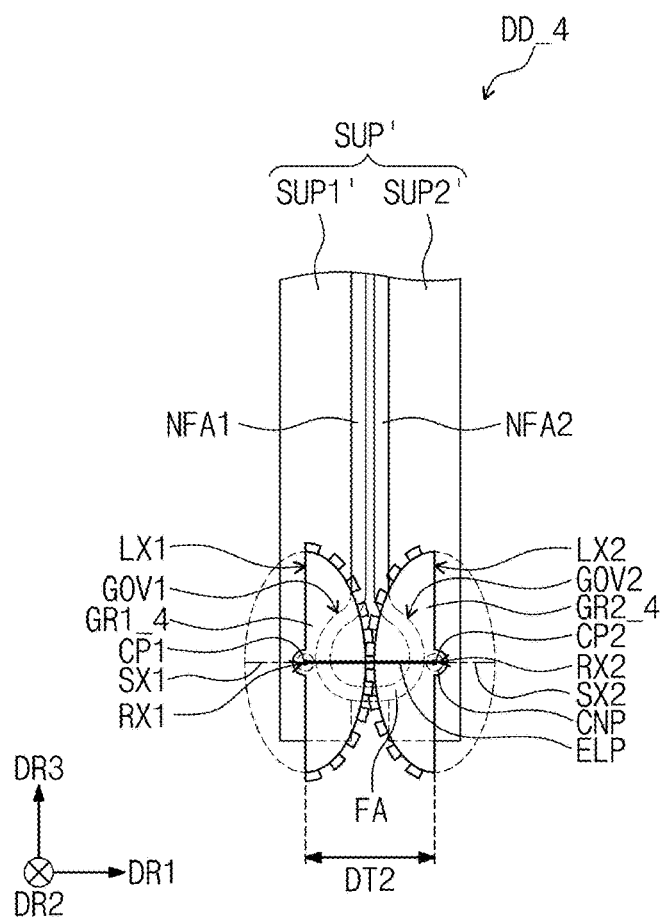
FIG. 22 is a view illustrating a folded state of the display device illustrated in FIG. 21.

FIG. 21 is a view illustrating a configuration of a display device according to another embodiment of the inventive concept. FIG. 22 is a view illustrating a folded state of the display device illustrated in FIG. 21.

FIGS. 21 and 22 illustrate a modified embodiment of the in-folding display device illustrated in FIGS. 19 and 20. Thus, hereinafter, the configurations of the display device DD_4 illustrated in FIGS. 21 and 22 will be described mainly on the different configuration from that of the display device DD_3 illustrated in FIGS. 19 and 20.

Referring to FIGS. 21 and 22, a first gear GR1-4 and a second gear GR2-4 may each have a shape corresponding to at least a portion of an elliptical shape when viewed in the second direction DR2. For example, the first gear GR1-4 and the second gear GR2-4 may have ½ elliptical shapes that are symmetrical to each other and are divided with respect to the major axis of the elliptical shape. For example, the first gear GR1-4 and the second gear GR2-4 may each have a ½ elliptical shape corresponding to an upper portion of the elliptical shape when dividing the elliptical shape by the major axis thereof.

The first gear GR1_4 and the second gear GR2_4 may rotate about a first rotational axis RX1 and a second rotational axis RX2, respectively, while engaging with each other, and thus, a display module DM may be folded. Even when the first gear GR1_4 and the second gear GR2_4 do not have completely elliptical shapes, the in-folding operation of the display device DD_4 may easily be performed as illustrated in FIGS. 21 and 22.

Figure 23:
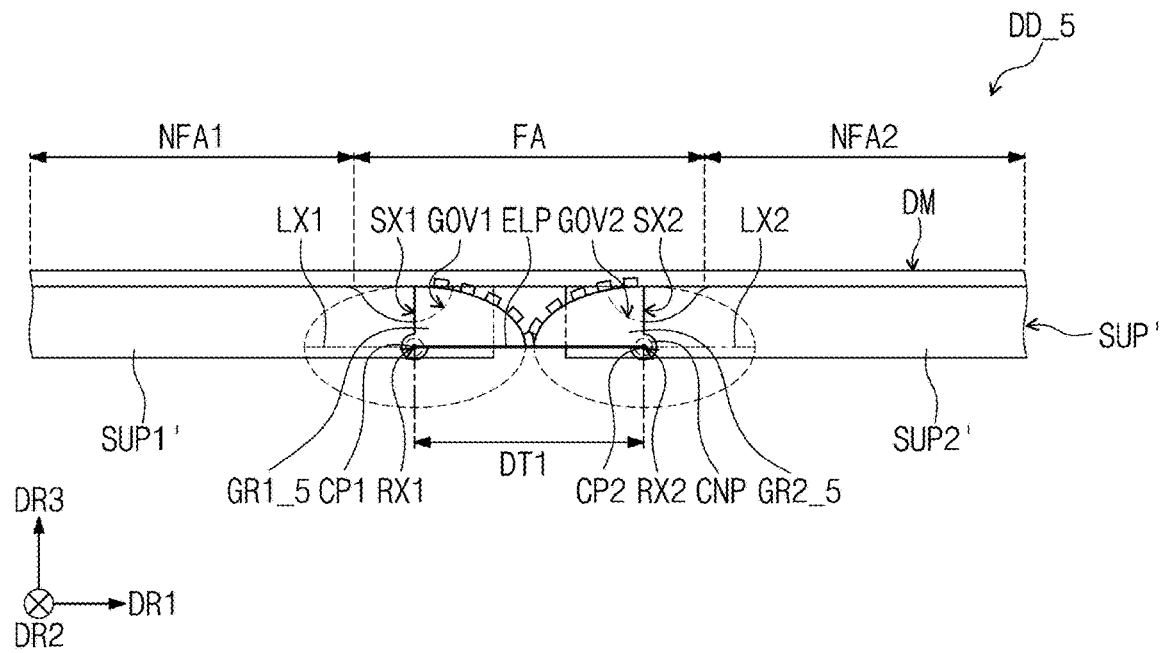
FIG. 23 is a view illustrating a configuration of a display device according to another embodiment of the inventive concept.
Figure 24:
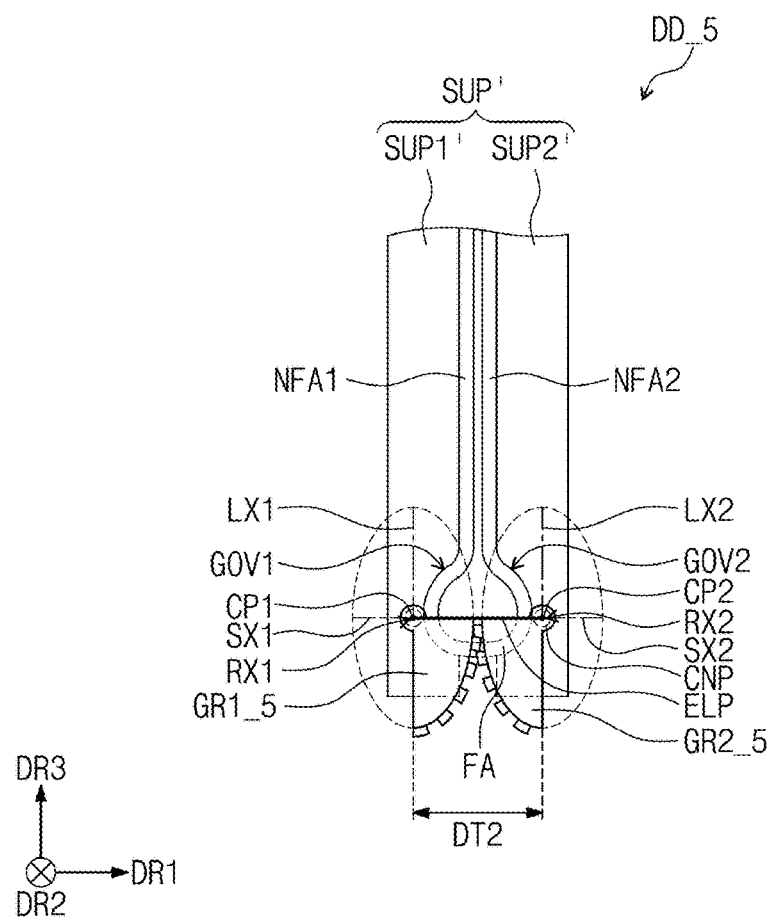
FIG. 24 is a view illustrating a folded state of the display device illustrated in FIG. 23.

FIG. 23 is a view illustrating a configuration of a display device according to another embodiment of the inventive concept. FIG. 24 is a view illustrating a folded state of the display device illustrated in FIG. 23.

FIGS. 23 and 24 illustrate modified embodiments of the in-folding display device illustrated in FIGS. 19 and 20. Thus, hereinafter, the configurations of the display device DD_5 illustrated in FIGS. 23 and 24 will be described mainly on the configuration different from that of the display devices DD illustrated in FIGS. 19 and 20.

Referring to FIGS. 23 and 24, a first gear GR1-5 and a second gear GR2-5 may each have a shape corresponding to at least a portion of an elliptical shape when viewed in the second direction DR2. For example, the first gear GR1-5 and the second gear GR2-5 may have ¼ elliptical shapes that are symmetrical to each other and are divided with respect to the major axis and the minor axis of the elliptical shape.

In an embodiment, for example, the first gear GR1_5 may have a ¼ elliptical shape corresponding to the upper right portion of the elliptical shape when dividing the elliptical shape with respect to the major axis and the minor axis thereof. The second gear GR2_5 may have a ¼ elliptical shape corresponding to the upper left portion of the elliptical shape when dividing the elliptical shape with respect to the major axis and minor axis thereof.

The first gear GR1_5 and the second gear GR2_5 may rotate about a first rotational axis RX1 and a second rotational axis RX2, respectively, while engaging with each other, and thus, the display module DM may be folded. Even when the first gear GR1_5 and the second gear GR2_5 do not have completely elliptical shapes, the in-folding operation of the display device DD_5 may easily be performed as illustrated in FIGS. 23 and 24.

According to an embodiment of the inventive concept, during a folding operation of a display device, first and second rotary axes defined by first and second gears move so as to be close to each other, and thus, the folding region of a display module may be more easily folded. In addition, during an unfolding operation of the display device, the first and second rotary axes move so as to be far from each other, and thus, the folding region may be more flatly unfolded.

So far, the inventive concept has been described in connection with preferred embodiments thereof. However, those of ordinary skill in the art will recognize that many modifications and variations are possible without departing from the spirit and scope set forth in the following claims. In addition, embodiments disclosed herein are not intended to limit the spirit and scope of the inventive concept. Rather, the appended claims and all technical idea within the range equivalent thereto should be understood to be included in the spirit and scope of the inventive concept.

What is claimed is:

1. A display device comprising:
a display module;
a first support part and a second support part which are disposed under the display module and spaced apart from each other in a first direction;
a first gear disposed on each of both opposite side surfaces defining opposing edges of the first support part which are opposite each other in a second direction and connected to each of the both opposing side surfaces of the first support part, the second direction crossing the first direction;
a second gear disposed on each of both opposite side surfaces defining opposing edges of the second support part which are opposite each other in the second direction and connected to each of the both opposing side surfaces of the second support part, the second gear being disposed adjacent to the first gear in the first direction and engaged with the first gear, wherein each of the first gear and the second gear has a shape corresponding to at least a portion of an elliptical shape when viewed in the second direction; and
an elastic part which connected a center section of an outer side surface of the first gear and a center section of an outer side surface of the second gear, and the outer side surface of the first gear does not face the first support part and the outer side surface of the second gear does not face the second support part.

2. The display device of claim 1, wherein the display module comprises:
a first non-folding region overlapping the first support part in a plan view;
a second non-folding region overlapping the second support part in the plan view; and
a folding region disposed between the first non-folding region and the second non-folding region,
wherein the folding region is bendable by rotation of the first gear and the second gear, such that the display module is foldable.

3. The display device of claim 2, wherein:
the first gear comprises a first long axis corresponding to a major axis of a first elliptical shape corresponding to the elliptical shape of the first gear, a first short axis corresponding to a minor axis of the first elliptical shape, and a first center point corresponding to the center of the first elliptical shape; and
the second gear comprise a second long axis corresponding to a major axis of a second elliptical shape corresponding to the elliptical shape of the second gear, a second short axis corresponding to a minor axis of the second elliptical shape, and a second center point corresponding to a center of the second elliptical shape.

4. The display device of claim 3, wherein:
the first gear rotates about a first rotation axis extending in the second direction and overlapping the first center point when viewed in the second direction; and
the second gear rotates about a second rotation axis extending in the second direction and overlapping the second center point when viewed in the second direction.

5. The display device of claim 3, wherein:
when the display module is in an unfolded state, the first long axis and the second long axis are disposed on a same line and are parallel to the first direction; and
when the display module is in a folded state, the first short axis and the second short axis are disposed on a same line and are parallel to the first direction.

6. The display device of claim 3, wherein a first distance between the first center point and the second center point when the display module is in an unfolded state is different from a second distance between the first center point and the second center point when the display module is in a folded state.

7. The display device of claim 6, wherein the first distance is greater than the second distance.

8. The display device of claim 6, wherein the first distance is equal to a length of a curved surface of the folding region bent when the display module is in the folded state.

9. The display device of claim 6, wherein the first distance is greater than a length of a curved surface of the folding region bent when the display module is in the folded state.

10. The display device of claim 2, wherein the display module is out-folded such that the display module is exposed to an outside when the display module is in a folded state.

11. The display device of claim 10, wherein:
one side of the first support part and one side of the second support part, which face each other, have ¼ circular shapes symmetrical to each other; and
when the display module is out-folded, the one side of the first support part and the one side of the second support part, as viewed in the second direction, are adjacent to each other and form a semicircle shape.

12. The display device of claim 2, wherein the display module is in-folded such that the display module is not exposed to an outside when the display module is in a folded state.

13. The display device of claim 1, wherein the first gear and the second gear are adjacent to one side of the first support part and one side of the second support part, respectively, and the one side of the first support part and the one side of the second support part face each other.

14. The display device of claim 1, wherein when viewed in the second direction, each of the first gear and the second gear has an entire elliptical shape, and the elliptical shape has a major axis parallel to the first direction when the display module is in an unfolded state.

15. The display device of claim 1, wherein when viewed in the second direction, the first gear and the second gear are symmetrical to each other and each of the first gear and the second gear has a ½ elliptical shape divided with respect to a major axis of the elliptical shape.

16. The display device of claim 1, wherein when viewed in the second direction, the first gear and the second gear are symmetrical to each other and each of the first gear and the second gear has a ¼ elliptical shape divided with respect to a major axis and a minor axis of the elliptical shape.

17. A display device comprising:
a foldable display module;
a first support part and a second support part which are disposed under the display module and are spaced apart from each other in a first direction;
a first gear connected to each of both sides of the first support part that are opposite each other in a second direction crossing the first direction, wherein the first gear is configured to rotate about a first rotation axis extending in the second direction; and
a second gear connected to each of both sides of the second support part that are opposite each other in the second direction, wherein the second gear is configured to rotate about a second rotation axis extending in the second direction, and engaged with the first gear in the first direction,
wherein a first distance in the first direction between a first center point of the first gear and a second center point of the second gear when the display module is in an unfolded state is different from a second distance between the first center point and the second center point in the first direction when the display module is in a folded state,
wherein the first distance is greater than the second distance.

18. The display device of claim 17, wherein when viewed in the second direction, each of the first gear and the second gear has an elliptical shape, and the elliptical shape has a major axis parallel to the first direction when the display module is in the unfolded state.

19. A display device comprising:
a foldable display module;
a first support part and a second support part which are disposed under the display module and are spaced apart from each other in a first direction;
a first gear connected to each of both sides of the first support part that are opposite each other in a second direction crossing the first direction, wherein the first gear is configured to rotate about a first rotation axis extending in the second direction; and
a second gear connected to each of both sides of the second support part that are opposite each other in the second direction, wherein the second gear is configured to rotate about a second rotation axis extending in the second direction, and engaged with the first gear in the first direction,
wherein a first distance in the first direction between a first center point of the first gear and a second center point of the second gear when the display module is unfolded is greater than or equal to a length of a curved surface of a folding region of the display module when the display module is folded, and the first center point of the first gear and the second center point of the second gear overlap the first rotation axis and the second rotation axis, respectively, when viewed in the second direction.

* * * * *